US005108535A

United States Patent [19]

Ono et al.

[11] Patent Number: 5,108,535

[45] Date of Patent: Apr. 28, 1992

[54] DRY ETCHING APPARATUS

[75] Inventors: Kouichi Ono; Tatsuo Oomori, both of Amagasaki, Japan

[73] Assignee: Mitsubishi Denki Kabushiki Kaisha, Japan

[21] Appl. No.: 538,931

[22] Filed: Jun. 15, 1990

[30] Foreign Application Priority Data

Jun. 15, 1989 [JP] Japan ................................ 1-153191
May 18, 1990 [JP] Japan ................................ 2-129981

[51] Int. Cl.[5] ...................... H01L 21/306; B44C 1/22; C03C 15/00; C03C 25/06

[52] U.S. Cl. .................................... 156/345; 156/643; 156/646; 204/298.35; 204/298.36

[58] Field of Search ...................... 156/643, 646, 345; 118/728, 50.1, 620; 427/38; 204/192.32, 192.37, 298.31, 298.34, 298.35, 298.36; 219/121.36, 121.4, 121.41, 121.5

[56] References Cited

FOREIGN PATENT DOCUMENTS 0026337 8/1984 European Pat. Off. .
0388800 9/1990 European Pat. Off. .

OTHER PUBLICATIONS

Suzuki et al., "Anisotropic Etching . . . Beam", Journal of Applied Physics 64 (7), Oct. 1988, pp. 3697-3705.
Geis et al., "Hot-Jet Etching . . . Si", Journal of Vacuum Science Technology B5(1), 1987, pp. 363-365.

*Primary Examiner*—William A. Powell
*Attorney, Agent, or Firm*—Leydig, Voit & Mayer

[57] ABSTRACT

A dry etching apparatus includes a discharge room in which a gas plasma is created by a discharge, an ejection nozzle for ejecting the plasma gas, a first vacuum room into which the plasma gas is introduced through the ejecting nozzle by supersonic expansion of the plasma gas, and a second vacuum room including a skimmer for extracting a supersonic molecular flow, the supersonic molecular flow of the plasma gas taken into the second vacuum room being blown against the material to be etched.

18 Claims, 20 Drawing Sheets

FIG .22.(a)
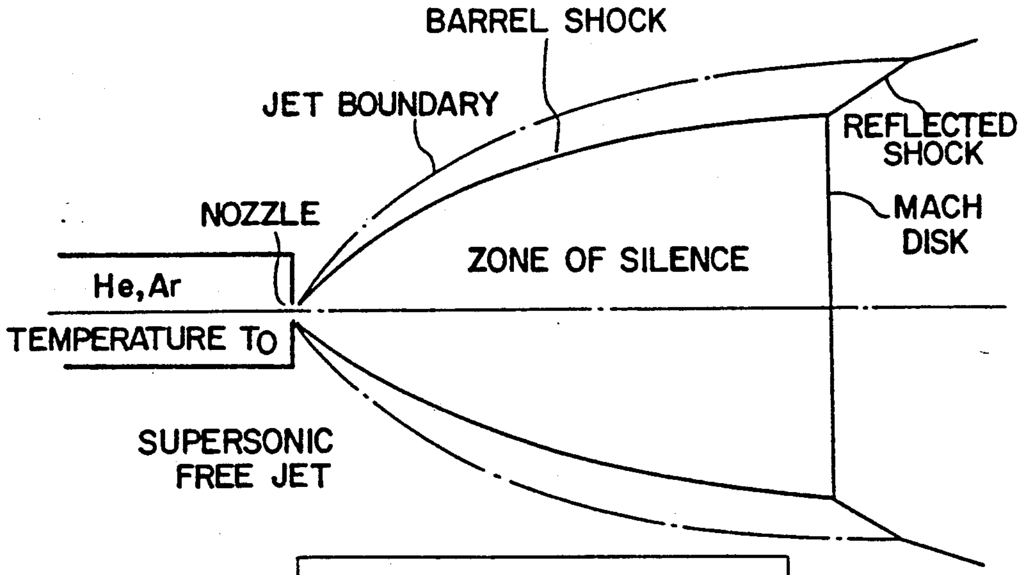
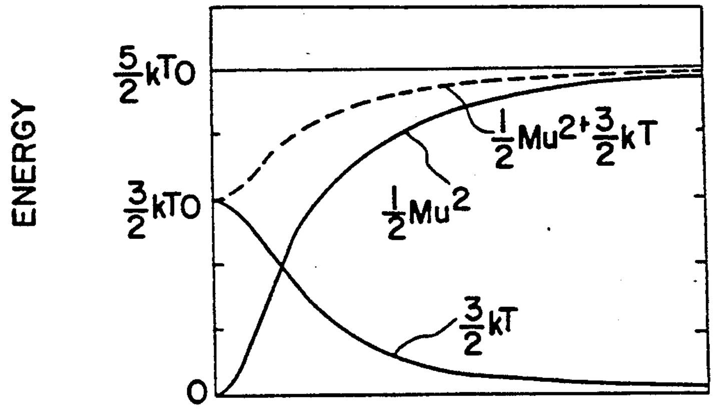
FIG .22.(b)
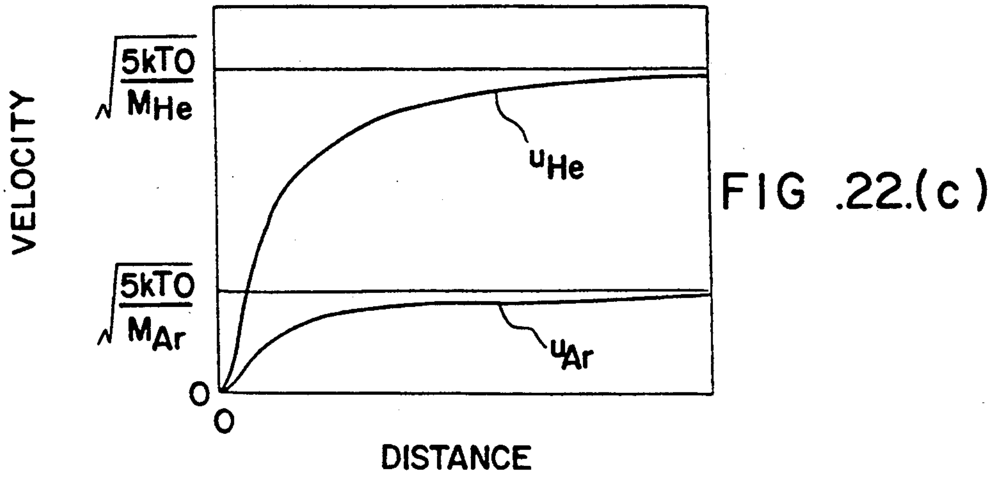
FIG .22.(c)

DRY ETCHING APPARATUS

FIELD OF THE INVENTION

The present invention relates to a dry etching apparatus that enables low damage, high selectivity, and highly anisotropic etching which are indispensable in semiconductor device fabricating processes.

BACKGROUND OF THE INVENTION

In a dry etching semiconductor device fabricating process, a high selectivity, that is, faster etching of a thin film than of the underlying substance or mask material such as photoresist, is required. Furthermore, a high anisotropy, that is, faster etching perpendicular than parallel to the surface of a thin film is required. Furthermore, a low likelihood of damage of the surface of the thin film etched is required. The requirements for etching, such as high selectivity, high anisotropy, and low likelihood of damage, increase with an increasing degree of device integration.

Prior art dry etching apparatus utilizing a high frequency discharge plasma an RF discharge or microwave discharge are widely adopted in semiconductor device fabrication processes for fine pattern processing ability and mass producibility.

FIG. 6 is a schematic diagram showing a prior art dry etching apparatus using an RF discharge plasma disclosed in "Opto Plasma Processing", Kazuo Akashi, Shuzou Hattori, Osamu Matsumoto (Nikkan Kogyo Shinbun-sha, Tokyo, 1986), Chapter 10, "Basis of Plasma Etching" (by Yukio Yasuda).

In FIG. 6, reference numeral 1 designates a substrate to be etched, reference numeral 2 designates a first parallel plate electrode on which the substrate 1 is placed, reference numeral 3 designates a second parallel plate electrode arranged confronting to the first parallel plate electrode 2. Reference numeral 4 designates a plasma reaction vacuum container in which the first parallel plate electrode 2 and the second parallel plate electrode 3 are provided. Reference numeral 5 designates a vacuum exhausting means for exhausting internal gas of the container 4. Reference numeral 6 designates a RF power applying means for applying RF power between the first parallel plate electrode 2 and the second parallel plate electrode 3. Reference numeral 7 designates a gas bomb in which etching gas A which is to be supplied to the plasma reaction container 4 is contained. Reference numeral 8 designates a gas flow rate control means for adjusting the flow rate of etching gas from the gas bomb 7 to the container 4. Reference numeral 9 designates a pressure meter for observing the pressure of the etching gas in the container 4. Reference numeral 10 designates an RF discharge plasma generated between the first parallel plate electrode 2 and the second parallel plate electrode 3.

As material to be etched, underlying substance, and photoresist on the substrate 1 to be etched, polycrystalline silicon, silicon dioxide, and polymethyl methacrylate are respectively used and as etching gas A in the gas bomb 7, a mixture of chlorine ($Cl_2$) and argon (Ar) is used. The frequency of the RF power applying means 6 is, for example, 13.56 MHz.

A description is given of the operation hereinafter.

First of all, the substrate 1 to be etched is placed on the first parallel plate electrode 2 in the plasma reaction vacuum container 4, and thereafter vacuum exhaustion in the container 4 is carried out by the vacuum exhaustion means 5. Subsequently, the flow rate of the etching gas A supplied to the container 4 from the gas bomb 7 is adjusted and established by the gas flow rate control means 8, and further the gas pressure in the container 4 is observed by the pressure meter 9 and the gas exhaustion speed of the vacuum exhaustion means 5 is adjusted and the etching gas pressure in the container 4 is established.

Subsequently, when RF power is applied to the first and second parallel plate electrodes 2 and 3 by the RF power applying means 6, the etching gas in the plasma reaction container 4 is ionized to be in a plasma state by the high frequency glow discharge generated between the electrodes 2 and 3 and reactive weakly ionized plasma 10 is generated. By the neutral atomic radicals or atomic ions generated or neutral molecular radicals or molecular ions constituted by those combinations, the substance on the substrate 1 is etched.

Here, when a mixed gas of $Cl_2$ and Ar is used as the etching gas A, Cl is generated as neutral atomic radical, $Cl^+$ and $Ar^+$ are generated as atomic ions, and $Cl_2^+$ is generated as molecular ions. In these examples, there are no molecular radials. In addition, the etching gas pressure in the plasma reaction container 4 is 0.01 to 1 Torr, $3\times10^{14}$ to $3\times10^{16}$ $cm^{-3}$ gas density, and the plasma density is approximately $10^9$ to $10^{11}$ $cm^{-3}$.

FIG. 7 is a schematic diagram showing a mechanism in which the substance on the substrate placed on the electrode in the plasma is etched in the prior art dry etching apparatus using an RF discharge plasma. In this discharge plasma, there exists a plurality of kinds of neutral atoms and molecules having various energies and their ions and electrons and photons (radiation) having various energies, but the particles directly contributing to the etching of the substance on the substrate are atomic and molecular ions and neutral atomic and molecular radicals in the space charge region (sheath) produced in the neighborhood of the substrate.

In this sheath region, positive ions having positive charges are likely to be accelerated in the substrate direction by the sheath voltage of about 100 to 1000 V (plasma potential+self bias voltage of the electrode) and be vertically incident on the surface of substrate. However, the neutral radicals do not respond to the sheath voltage and they are isotropically incident on the surface of substrate by the thermal disordered movement at approximately 500° to 1000° K.

In such dry etching apparatus, the selectivity of etching, that is, the ratio of the etching speed of the thin film to be etched and the etching speed of the underlying substance or the mask material such as photoresist is mainly obtained by the difference in the chemical reactivity against the respective materials of neutral radicals. The chemical etching due to only neutral radicals isotropically incident on the surface of substrate is isotropical.

On the other hand, the anisotropy of etching, that is, the ratio between the etching speed perpendicular to the surface of thin film to be etched and the etching speed parallel to the surface is obtained mainly by the directionality of movement against the surface of ions which are accelerated by the sheath voltage and incident vertically to the surface of substrate, and the physical sputtering due to ions is non-selective to the respective material and the surface layer of the thin film to be etched is damaged. Practically, etching of substance on the substrate proceeds by the competition process of these neutral radicals and ions which is called as an ion assist process.

The prior art dry etching apparatus using discharge plasma is constituted such that anisotropic of etching is obtained only by the directionality of the movement of ions which are accelerated by the sheath voltage and vertically incident on the substrate surface in the space charge region (sheath) produced in the neighborhood of the substrate. In order to enhance the anisotropy of etching, the sheath voltage or further incident energy of ions into the substrate has to be enhanced, and as a result, since high anisotropy is desired, the selectivity is much lowered, thereby resulting in an increase in damage.

SUMMARY OF THE INVENTION

The present invention is directed to solving the above-described problems and has for its object to provide a dry etching apparatus that realizes etching which satisfies a super high anisotropy, a super high selectivity, and a super low likelihood of damage.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

In accordance with the present invention, a dry etching apparatus includes a discharge room which, provided with an ejection nozzle for generated gas, generates a plasma gas by ionizing atoms and molecules of raw material gas, a first vacuum room to which the plasma gas is introduced through the ejection nozzle in a supersonic free jet by supersonically expanding the plasma gas, and a second vacuum room which, provided with a skimmer for extracting supersonic molecular flow from the supersonic free jet of plasma gas, introduces a supersonic molecular flow of the plasma gas, and the supersonic molecular flow of the plasma gas is blown to the substrate to be etched thereby to etch the substrate.

In accordance with the present invention, in addition to the discharge room and first and second vacuum rooms, a charged particle removing means for removing charged particles, that is, ions and electrons from the supersonic molecular flow of plasma gas extracted into the second vacuum room, is provided and the supersonic molecular flow of neutral atomic and molecular gas is blown to the substrate to be etched to carry out etching.

In accordance with the present invention, in a dry etching apparatus, a plasma of reactive gas is produced by discharge, the plasma is supersonically expanded into a first vacuum room thereby to produce a supersonic free jet of plasma through a two-dimensional nozzle with an opening having a cross-section of rectangular slit shape, and further supersonic molecular flow of plasma is extracted into the second vacuum room from the supersonic free jet through the two-dimensional skimmer having an opening of cross-section of rectangular slit shape, and the supersonic molecular flow of plasma is blown out to the substrate to be etched thereby to carry out etching.

Furthermore, a charged particle removing means for removing charged particles, that is, ions and electrons from the supersonic molecular flow of plasma extracted into the second vacuum room is provided and the supersonic molecular flow of neutral atomic and molecular gas is blown to the substrate to be etched and etching is thus carried out.

Furthermore, the position of the substrate to be etched is moved during the etching in the short edge direction relative to the supersonic molecular flow whose cross-sectional configuration in a direction perpendicular to the flow is a rectangular slit shape.

Furthermore, in accordance with the present invention, in a dry etching apparatus, a reactive gas and light element gas such as helium or hydrogen are introduced to a discharge room, a plasma of mixed gas is generated, the plasma is supersonically expanded into the first vacuum room to produce a supersonic jet of plasma, and further the supersonic molecular flow of plasma is extracted into the second vacuum room from the supersonic free jet through a skimmer, and the supersonic molecular flow of plasma is blown to the substrate to be etched thereby to carry out etching.

Furthermore, there is provided a charged particle removing means for removing charged particles, that is, ions and electrons from the supersonic molecular flow of plasma extracted into the second vacuum room and the supersonic molecular flow of neutral atomic and molecular gas is blown to a substrate to be etched and etching is carried out.

Furthermore, the discharge room is divided into two rooms and the first room is used for ionizing the light element gas such as helium or hydrogen which is introduced thereinto, and the second room for mixing both gases of the plasma gas which is flow thereinto and a reactive gas which is further introduced. The supersonic molecular flow of plasma is extracted into the second vacuum room or the supersonic molecular flow of neutral atomic and molecular gas which is obtained by removing ions and electrons from the supersonic molecular flow of plasma by the charge particle removing means is blown to a substrate to be etched thereby to carry out etching.

In accordance with the present invention, the plasma generated by discharge is supersonically expanded into vacuum thereby to produce a supersonic molecular flow of plasma that has quite low gas temperature, that is, has quite low thermal movement speed of heavy particles such as neutral atoms and molecules, and ions so that the interaction between the heavy particles can be ignored. The supersonic molecular flow of plasma is blown to a substrate to be etched, therefore, the ions and neutral atoms and molecules of plasma are vertically incident on the surface of substrate as a low temperature and low energy particle beam. In this case, the speed component parallel to the substrate surface of the ions and neutral radicals is quite low relative to the incident speed in the vertical direction and further the incident energy is quite low relative to the physical sputtering threshold. In this apparatus, therefore, the anisotropic chemical etching due to neutral radicals controls the etching process of the substance on the substrate and etching that satisfies not only super high anisotropy but also super high selectivity and super low likelihood of damage is possible.

Furthermore, a supersonic molecular flow of neutral atomic and molecular gas that has quite low gas temperature and quite low thermal movement speed of neutral atoms and molecules such that the interaction between particles can be ignored is produced by removing ions and electrons from the supersonic molecular flow of plasma. This supersonic molecular flow of neutral atomic and molecular gas is blown to the substrate to be etched and the neutral atoms and molecules are vertically incident on the surface of substrate as low temperature and low energy particle beam.

Accordingly, in this case, the etching of the substance on the substrate proceeds only by anisotropic chemical etching due to neutral radicals and an etching that satisfies super high anisotropy, super high selectivity, and super low likelihood of damage is possible and electrostatic destruction due to charge-up of substrate to be etched can be prevented.

Furthermore, in accordance with the present invention, in a dry etching apparatus, a plasma generated by discharge is supersonically expanded in vacuum and a supersonic molecular flow of plasma that has quite low gas temperature and quite low thermal movement of heavy particles such as neutral atoms and molecules and ions s that the interaction between heavy particles can be ignored is generated. This supersonic molecular flow of plasma is blown to a substrate to be etched. Therefore, the ions and neutral atomic and molecular radicals of plasma are vertically incident on the surface of substrate as a low temperature and low energy particle beam. In this case, the velocity component parallel to the substrate surface of ions and neutral radicals is quite low relative to the incident speed in the vertical direction and the incident energy is quite low as compared with the physical sputtering threshold. Therefore, in this dry etching apparatus, the anisotropic chemical etching due to neutral radicals controls the etching process of the substance on substrate and therefore, etching that satisfies not only the super high isotropy but also super high selectivity and super low likelihood of damage is possible.

Furthermore, in the present invention, charged particles such as ions and electrodes are removed from the supersonic molecular flow of plasma and supersonic molecular flow of neutral atomic and molecular gas that has quite low gas temperature and quite low thermal movement velocity of neutral atoms and molecules so that the interaction between particles can be ignored is produced supersonic molecular flow of neutral atomic and molecular gas is blown to a substrate to be etched. Therefore, the neutral atomic and molecular radicals are vertically incident on the surface of substrate as a low temperature and low energy particle beam. In this case, the velocity component parallel to the surface of substrate of neutral radicals is quite low a compared with the incident speed in the vertical direction and the input energy is quite low as compared with the physical sputtering threshold. Therefore, by only the anisotropic chemical etching due to neutral radicals, the etching of the substance on substrate proceeds and an etching that satisfies not only super high anisotropy but also super high selectivity and super low likelihood of receiving damages is possible and an electrostatic destruction caused by discharge (charge-up) of the substrate to be etched due to charged particles can be prevented.

Furthermore, in the supersonic molecular flow of plasma or supersonic molecular flow of neutral atomic and molecular gas, a two-dimensional nozzle and skimmer having an opening of rectangular shape is used for generation thereof, the cross-sectional configuration perpendicular to the flow becomes rectangular slit shape. Therefore, etching is carried out while moving the position of the substrate to be etched in the short edge direction of the cross-section relative to the supersonic molecular flow, and etching that satisfies not only super high anisotropy but also super high selectivity and super low likelihood of damage is possible for a large sized substrate.

Furthermore, in a dry etching apparatus according to the present invention, a plasma of mixed gas is generated by introducing reactive gas and light element gas such as helium or hydrogen into a discharge room, and the plasma is supersonic expanded into a vacuum, and a supersonically molecular flow that has quite low gas temperature and quite low thermal movement velocity of heavy particles such as neutral atoms and molecules and ions so that the interaction between heavy particles can be ignored is generated. This supersonic molecular flow of plasma is blown to a substrate to be etched. Therefore, the ions and neutral atomic and molecular radicals of plasma are vertically incident on the surface of substrate as a low temperature and low energy particle beam. In this case the velocity component parallel to the surface of substrate of ions and neutral radicals is quite small as compared with the incident speed in the vertical direction and further the incident energy is quite low as compared with the physical sputtering threshold. Furthermore, when the mixing ratio of the reactive gas to the light element gas is made small, the incident speed in the vertical direction of ions and neutral radicals concerning reactive gas against the surface of substrate is increased up to a value approximately equal to the incident speed of atoms and molecules concerning the light element gas. Therefore, in this dry etching apparatus, a chemical etching more anisotropic than that by fast neutral radicals controls the etching process of the substance on the substrate and an etching that satisfies not only super high anisotropy but also super high selectivity and super low likelihood of damage can be realized at high speed.

Furthermore, a supersonic molecular flow of neutral atomic and molecular gas that has quite low gas temperature and quite low thermal movement velocity of neutral atoms and molecules so that the interaction between particles ca be ignored is taken out by removing charged particles such as ions and electrons from the supersonic molecular flow of plasma and this supersonic molecular flow of neutral atomic and molecular gas is blown to a substrate to be etched. Therefore, the neutral atomic and molecular radicals are vertically incident on the surface of substrate as low temperature and low energy particle beam. In this case, the velocity component parallel to the surface of substrate of neutral radicals is quite low as compared with the incident speed in the vertical direction and the input energy is quite low as compared with the physical sputtering threshold. Furthermore, when the mixing ratio of reactive gas to the light element gas is made small, the incident speed in the vertical direction against the surface of the substrate of neutral radicals concerning the reactive gas is increased up to the value approximately equal to the incident speed of atoms and molecules concerning light element gas. Therefore, the etching of the substance on the substrate proceeds only by the anisotropic chemical etching due to neutral radicals and a high speed etching that satisfies not only super high anisotropy but also super high selectivity and super low likelihood of receiving damages is possible and further electrostatic destruction caused by charging (charge up) of substrate to be etched due to charged particles can be prevented.

Furthermore, the discharge room is divided into two rooms and a first room is used for ionizing the light element gas such as helium or hydrogen which is introduced thereinto and a second room is used for mixing both gases of plasma gas which is flow thereinto and reactive gas which is introduced thereinto. Therefore, the ionization and decomposition of reactive atoms and molecules proceeds not by the direct discharge but by the interaction between the light element gas plasma generated by the direct discharge, that is, the collision between the light element gas atoms and molecules and electrons of plasma generated and excited by the ionization and decomposition and the reactive gas atoms and molecules.

Therefore, the amount of neutral radicals generated by the reactive gas atoms and molecules that are decomposed is larger than that by direct discharge and the degree of corrosion or damage of the discharge room by the direct discharge of reactive gas is reduced. Furthermore, since the supersonic molecular flow of plasma extracted as described above or a supersonic molecular flow of neutral atomic or molecular gas which is obtained by removing ions or electrons from the supersonic molecular flow of plasma by the above described charged particle removing means is blown to a substrate to be etched thereby to carry out etching that satisfies super high anisotropy, super high selectivity, and a super low likelihood of damage can be obtained at a higher speed. The deterioration of the discharge room is suppressed and the life time thereof is lengthened.

BRIEF DESCRIPTION OF THE DRAWINGS

FIG. 12(*b*) is a cross-sectional view showing a detail of a supersonic free jet shown in FIG. 11;

FIGS. 22(*a*), 22(*b*), and 22(*c*) are diagrams showing characteristics of flow in the silent region of the supersonic free jet of FIG. 21;

DETAILED DESCRIPTION OF THE PREFERRED EMBODIMENTS

Embodiments of the present invention will be described in detail with reference to the drawings.

Figure 1:
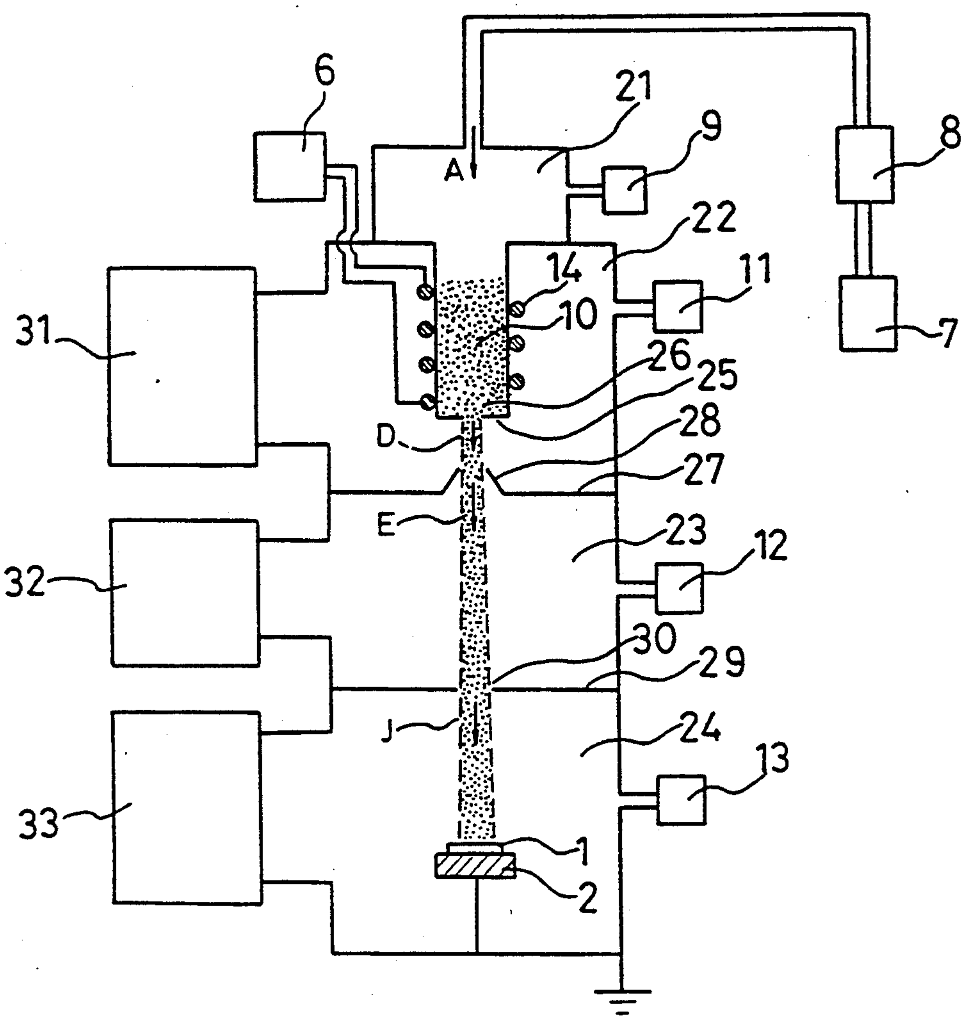
FIG. 1 is a cross-sectional view showing a construction of a dry etching apparatus according to a first embodiment of the present invention.

FIG. 1 shows a cross-sectional view of a main part showing a construction of a dry etching apparatus according to a first embodiment of the present invention.

In FIG. 1, reference numeral 21 designates a reactive gas discharge room, reference numeral 22 designates a first vacuum room arranged adjacent the discharge room 21. Reference numeral 23 designates a second vacuum room arranged adjacent the first vacuum room 22. Reference numeral 24 designates a third vacuum room arranged adjacent the second vacuum room 23 and which has an electrode 2 for mounting the substrate 1 to be etched. Reference numeral 26 designates a nozzle provided at an end 25 of the reactive gas discharge room 21. Reference numeral 27 designates a first partition wall for partitioning the first vacuum room 22 and the second vacuum room 23. Reference numeral 28 designates a skimmer provided at the first partition wall 27. Reference numeral 29 designates a second partition wall for partitioning the second vacuum room 23 and the third vacuum room 24. Reference numeral 30 designates a collimator provided at the second partition wall 29.

Reference numeral 31 designates a first vacuum exhaustion means for exhausting the first vacuum room 22. Reference numerals 32 and 33 designate a second and third vacuum exhaustion means for exhausting the second and third vacuum rooms 22 and 23, respectively. Reference numeral 7 designates a gas bomb containing etching gas A which is to be supplied to the reactive gas discharge room 21. Reference numeral 8 designates gas flow rate control means for adjusting the flow rate of etching gas into the discharge room 21 from the gas bomb 7. Reference numeral 9 designates a pressure meter for observing the pressure of etching gas in the discharge room 21. Reference numerals 11 to 13 designate first to third vacuum meters for observing the degree of vacuum in the first to third vacuum rooms 22 to 24, respectively. Reference numeral 14 designates a high frequency induction coil provided surrounding the reactive gas discharge room 21. Reference numeral 6 designates an RF power applying means for applying RF power to the coil 14.

Furthermore, reference numeral 10 designates a RF induction discharge plasma generated at a portion of the discharge room 21 where the coil 14 is provided. Reference character D designates a supersonic free jet of plasma produced when the plasma 10 is introduced into the first vacuum room 22 through the nozzle 26 and is supersonically expanded therein. Reference character E designates a supersonic molecular flow of plasma extracted into the second vacuum room 23 from the supersonic free jet D of plasma through the skimmer 28. Reference character J designates a supersonic molecular flow of plasma which flows into the third vacuum room 24 among the supersonic molecular flow E of plasma through the collimator 30. The substrate to be etched 1 is provided on the electrode 2 in the third vacuum room 24 so that the substrate 1 confronts the supersonic molecular flow J of plasma.

The nozzle 26, the skimmer 28, and the collimator 30 are arranged on a straight line on the same axis as the center axis of the supersonic free jet D in the first vacuum room 22, the supersonic molecular flow E in the second vacuum room 23, and the supersonic molecular flow J in the third vacuum room 24.

As for the material to be etched on the substrate to be etched 1, the underlying substance, and photoresist, polycrystalline silicon, silicon dioxide, and polymethyl methacrylate are used as in the prior art, and as for the etching gas A in the gas bomb 7, a mixture of $Cl_2$ and Ar is used as in the prior art. The frequency of RF power applying means 6 is the same as in the prior art, that is, 13.56 MHz.

A description is given of an operation of the dry etching apparatus according to this embodiment.

First of all, exhaustion of the first to third vacuum rooms 22 to 24 is carried out by the first to third vacuum exhaustion means 31 to 33, and the reactive gas discharge room 21 and the first to third vacuum rooms 22 to 24 are set at a predetermined degree of vacuum.

Subsequently, exhaustion by the first to third vacuum exhaustion means 31 to 33 is carried out and etching gas A is introduced into the reactive gas discharge room 21 through the gas flow rate control means 8 from the gas bomb 7. While observing the gas pressure in the discharge room 21 by the pressure meter 9, the etching gas flow rate is adjusted by the gas flow rate control means 8 and the gas pressure inside the discharge room 21 is established.

Subsequently, when RF power is applied to the high frequency induction coil 14 by the RF power applying means 6, the etching gas in the discharge room 21 is ionized by RF induction grow discharge or arc discharge and reactive weakly ionized plasma 10 is generated. Here, the pressure in the discharge room 21 is approximately $10^2$ to $10^3$ Torr, the temperature is approximately $10^{3°}$ to $10^{4°}$ K., and the pressure is displayed by the pressure meter 9.

The plasma of the etching gas A generated at the reactive gas discharge room 21 is introduced to the first vacuum room 22 through the nozzle 26 and it is supersonically expanded to produce a supersonic free jet D. The diameter of the opening of the nozzle 26 is, for example, approximately 1 mm, and the degree of vacuum in the first vacuum room 21 is held at approximately $10^{-3}$ to $10^{-2}$ Torr and this is displayed by the first vacuum meter 11.

Figure 2:
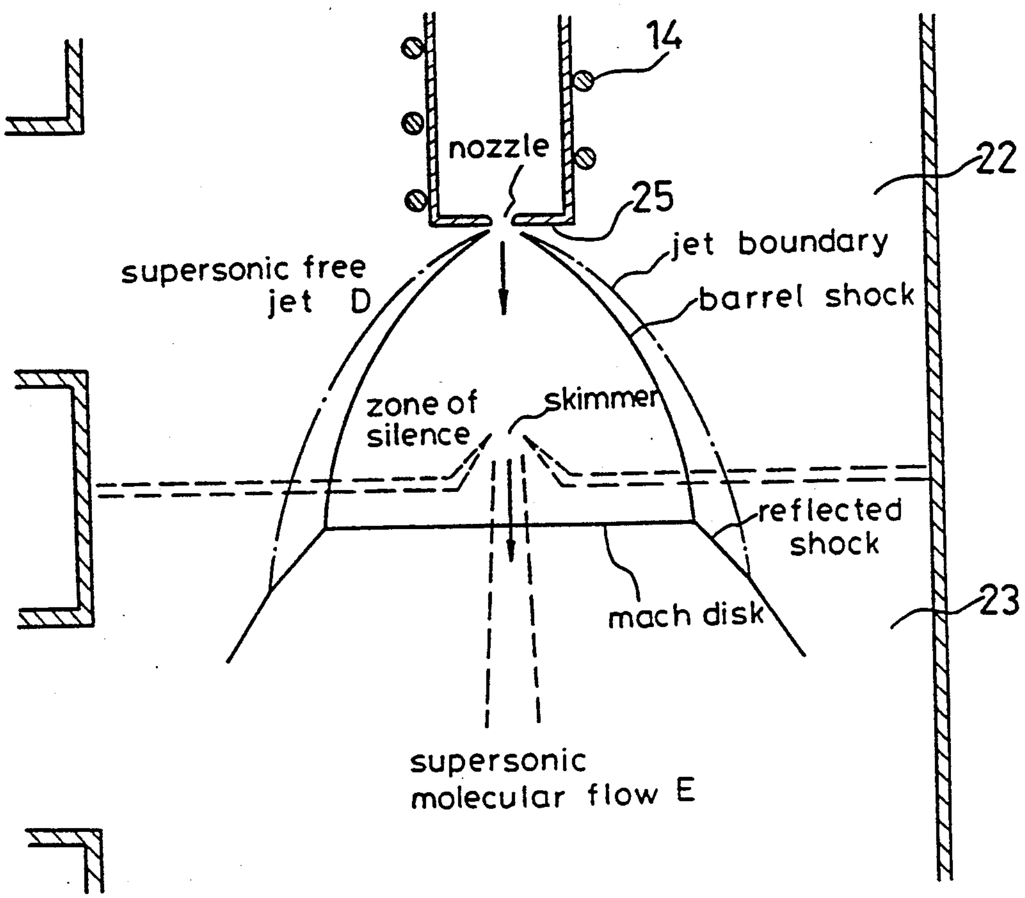
FIG. 2 is a cross-sectional view showing a detail of supersonic free jet shown in FIG. 1.

The above-described supersonic free jet D is, as shown schematically in FIG. 2, characterized by a region of supersonic free expansion flow which is called as "Zone of Silence" and a shock wave surrounding the Zone of Silence, which is called a "Barrel Shock" or "Mach Disk". Here, there is produced a "Jet Boundary" surrounding the "Barrel Shock" and a "Reflected Shock" downstream of the "Mach Disk". In the supersonic free expansion flow in the Zone of Silence, accompanying the transition downstream along the center axis of flow, there is the supersonic free expansion of gas. In other words, by adiabatic expansion of gas. The density and temperature of plasma, that is, the density and temperature of neutral atoms and molecules, ions, and electrons constituting the plasma are reduced. Therefore, the collision frequency between plasma particles is reduced and the degree of ionization is frozen, but the flow velocity is increased. And, at downstream more than approximately 10 times the diameter of opening of the nozzle 26, the gas temperature of the plasma, that is, the temperature of heavy particles such as neutral atoms and molecules and ions becomes quite low, i.e., below several degrees in absolute temperature, and the collision frequency between heavy particles becomes infinitesimal. However, the electron temperature of the plasma is not lowered to such a degree as the temperature of heavy particles and it is stopped at approximately $10^{3°}$ K..

In the supersonic free jet D of plasma, a skimmer 28 is arranged at a position where the supersonic free expansion is sufficiently developed along the center axis of flow thereby to sufficiently lower the gas temperature of the plasma and the thermal movement velocity of heavy particles such as neutral atoms and molecules and ions such that the interaction between heavy particles can be ignored. Concretely, the skimmer 28 is arranged at a first partition wall and the opening of the skimmer 28 has a configuration which does not give turbulence upstream of the supersonic free jet D, and the diameter of the opening is below approximately two or three times of the opening of the nozzle 26. A portion at the neighborhood of the center axis in the Zone of Silence of the supersonic free jet of plasma produced in the first vacuum room 22 by such skimmer 28 is extracted into the second vacuum room 23 as a supersonic molecular flow E. The degree of vacuum in the second vacuum room 23 is held at approximately $10^{-6}$ to $10^{-5}$ Torr and this is displayed by the second vacuum meter 12.

Here, the change in the state of the supersonic free jet D of plasma, for example the physical quantities such as gas density, temperature, and flow rate of plasma along the center axis of the flow of the size of the Zone of Silence is regulated by the configuration and diameter of opening of the nozzle 26, the pressure in the reactive gas discharge room 21, and the degree of vacuum in the first vacuum room 22. Therefore, in a case where supersonic molecular flow E of plasma is extracted into the second vacuum room 23 through the skimmer 28 from the Zone of Silence of the supersonic free jet D of plasma produced in the first vacuum room 22, in order to keep the extraction most appropriate against the change of various conditions, it is preferable to provide a mechanism which can vary the distance between the nozzle 26 and the skimmer 28 continuously as shown in this embodiment.

Next, an example of a mechanism for continuously varying the distance between the nozzle 26 and the skimmer 28 will be described with reference to FIG. 3. As shown in this figure, in this mechanism, the discharge room 21 is connected to the first vacuum room 22 by bellows 41, and by moving the reactive gas discharge room 21 in the arrow $\alpha$ and $\beta$ directions shown in FIG. 3 by extending and compressing the length of the bellows 41, the distance between the nozzle 26 and the skimmer 28 can be continuously varied. Therefore, it is possible to extract supersonic molecular flow E of plasma at the most appropriate manner from the supersonic free jet D of plasma whose state is varying against the changes in various conditions.

In the supersonic molecular flow E of plasma extracted into the second vacuum room 23 as above, the gas temperature of plasma is quite low, i.e., below several degrees at a absolute temperature, that is, the thermal movement velocity of heavy particles such as neutral atoms and molecules and ions is quite small and the interaction between heavy particles can be ignored. The supersonic molecular flow E of plasma having such characteristics flows into the third vacuum room 24 through the collimator 30 provided at the second partition wall 29. Here, the diameter of opening of the collimator 30 is less than approximately the diameter of the opening of the skimmer 28 and the degree of vacuum in the third vacuum room 24 is held at approximately $10^{-8}$ to $10^{-7}$ Torr and this is displayed by the third vacuum meter 13. Since a substrate to be etched 1 is provided on an electrode 2 confronting the supersonic molecular flow J of plasma that flows into the third vacuum room 24 through the collimator 30, the supersonic molecular flow J of plasma is blown perpendicular to the substrate to be etched 1.

Since the supersonic molecular flow J of reactive weakly ionized plasma which has quite low gas temperature such as several degrees at an absolute temperature and has quite low thermal movement velocity of heavy particles such as neutral atoms and molecules and ions so that the interaction between heavy particles can be ignored is blown to the substrate to be etched 1, the ions and neutral atomic and molecular radicals of the reactive weakly ionized plasma are incident perpendicular to the surface of substrate as a low temperature and low energy reactive particle beam. Therefore, the velocity component parallel to the surface of substrate of ions an neutral atomic and molecular radical is quite small as compared with the incident velocity in the perpendicular direction and the input energy is quite low as compared with the physical sputtering threshold.

Here, when a mixture of $Cl_2$ and Ar is used for the etching gas A similarly as in the prior art, Cl is generated as neutral atomic radicals, $Cl^+$ and $Ar^+$ are generated as atomic ions, and $Cl_2^+$ is generated as molecular ions. In the case of this example, there are no molecular radicals. Furthermore, the gas density of the supersonic molecular flow of plasma, that is, the density of heavy particles such as neutral atoms and molecules and ions is approximately $10^{12}$ to $10^{15}$ $cm^{-3}$ and the plasma density is approximately $10^{9}$ to $10^{12}$ $cm^{-3}$.

Figure 4:
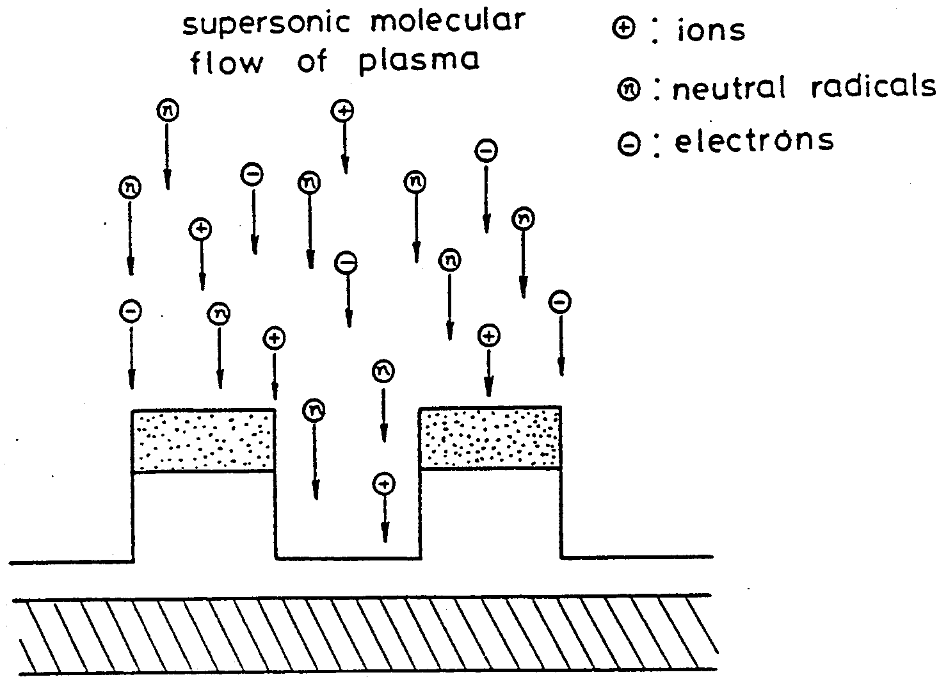
FIG. 4 is a schematic diagram showing a manner in which plasma particles are incident on the surface of a substrate to be etched in the apparatus.

FIG. 4 is a schematic diagram showing a mechanism in which the substance on a substrate disposed on the electrode confronting to the supersonic molecular flow of plasma is etched in a dry etching apparatus using supersonic molecular flow of plasma of this embodiment. In this case, similarly as in the prior art, a space charge region (sheath) is produced in the neighborhood of substrate and positive ions incident on the sheath region are accelerated to the substrate by the sheath voltage (plasma voltage) of about 10 V and are vertically incident on the surface of substrate On the other hand, the neutral radicals do not respond to the sheath voltage, but differently from the prior art, they are vertically incident on the surface of substrate in a state of supersonic molecular flow. Therefore, chemical etching due to neutral radicals which determine the selectivity of the etching becomes non-isotropic and the anisotropic etching is given at the same time.

Furthermore, the incident energy into the surface of substrate of ions is smaller than the physical sputtering threshold of about 20 eV even when it is accelerated by the sheath voltage, and etching due to a physical sputtering of surface of substrate by ions or a competition process of neutral radicals and ions which is called ion assist process does not arise, and the damage to the surface layer of the thin film to be etched does not arise.

After all, in the dry etching apparatus of this embodiment, the non-isotropic chemical etching due to neutral radicals controls the etching process of the substance on the substrate and an etching that satisfies not only super high anisotropy but also super high selectivity and super low likelihood of damage is carried out.

As described above, in this embodiment, the plasma 10 generated by discharge is supersonically expanded into the first vacuum room 22 through the nozzle 26 thereby to produce a supersonic free jet D of plasma. A supersonic molecular flow E of plasma is extracted into the second vacuum room 23 through the skimmer 28 from the supersonic free jet D, and this supersonic molecular flow of plasma which has quite low gas temperature and quite low thermal movement velocity of heavy particles such as neutral atoms and molecules and ions so that the interaction between heavy particles can be ignored is blown to a substrate to be etched 1 in the third vacuum room 24 through a collimator 30. Therefore, ions and neutral atoms and molecules of plasma are incident perpendicular to the surface of substrate as a low temperature and low energy particle beam. In this case, the velocity component parallel to the surface of the substrate of ions and neutral radicals is quite low as compared with the incident speed in the vertical direction and the incident energy is quite low as compared with the physical sputtering threshold. As a result, the anisotropic chemical etching due to neutral radicals controls the etching process of the substance on the substrate and a dry etching apparatus using a discharge plasma that can realize not only super high anisotropy but also super high selectivity and super low likelihood of receiving damage is obtained.

Figure 3:
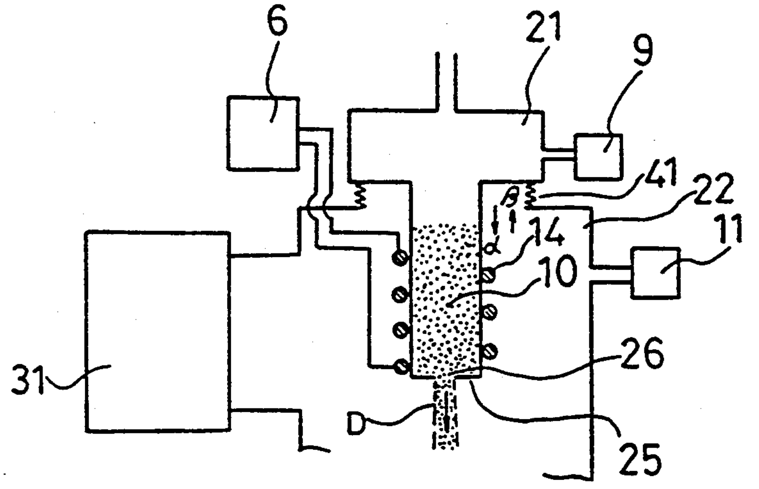
FIG. 3 is a diagram showing an example of a mechanism that varies the distance between the nozzle and skimmer continuously in the first embodiment.

Furthermore, in this embodiment, a mechanism for varying the distance between the nozzle 26 and the skimmer 28 continuously is provided as shown in FIG. 3, it is possible to extract the supersonic molecular flow E of plasma in a most appropriate manner from the supersonic free jet D of plasma whose state changes in response to the change of various conditions.

In the above-illustrated embodiment, the incident energy of ions and neutral radicals is lower than the physical sputtering threshold, but the incident energy can be larger than the physical sputtering threshold and physical sputtering using ions can be carried out.

For example, depending on the kind of material to be etched, it is required that the incident energy into the surface of the substrate of ions is higher than the physical sputtering threshold and not only the non-isotropic chemical etching due to neutral radicals but also etching due to a physical sputtering and an ion assist process which is in competition with neutral radicals and ions is added. Accordingly, in order to carry out most appropriate etching in response to the various substances to be etched, it is preferable to provide means for increasing the incident energy into the surface of the substrate of ions independently.

Another embodiment of the present invention in which a means for increasing the incident energy of ions is provided will be described with reference to FIG. 5.

Figure 5:
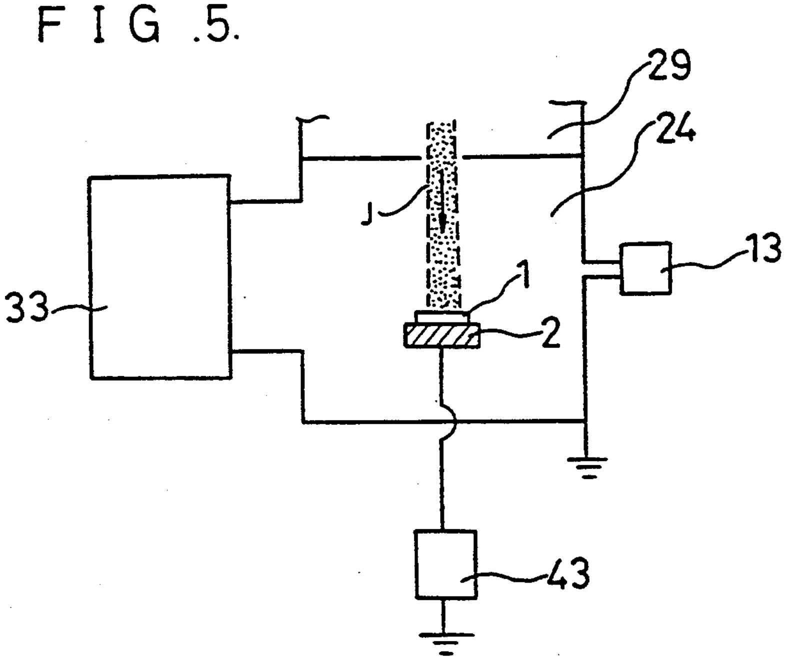
FIG. 5 is a cross-sectional view showing an RF power applying means for applying RF power to an electrode for mounting a substrate to be etched in the apparatus.
Figure 6:
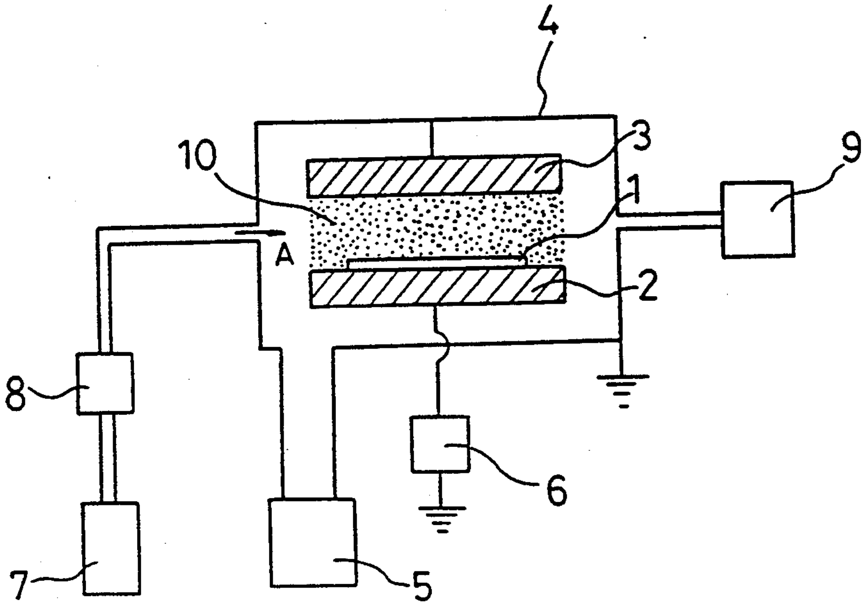
F I G .6. (PRIOR ART)
FIG. 6 is a cross-sectional view schematically showing a prior art dry etching apparatus.
Figure 7:
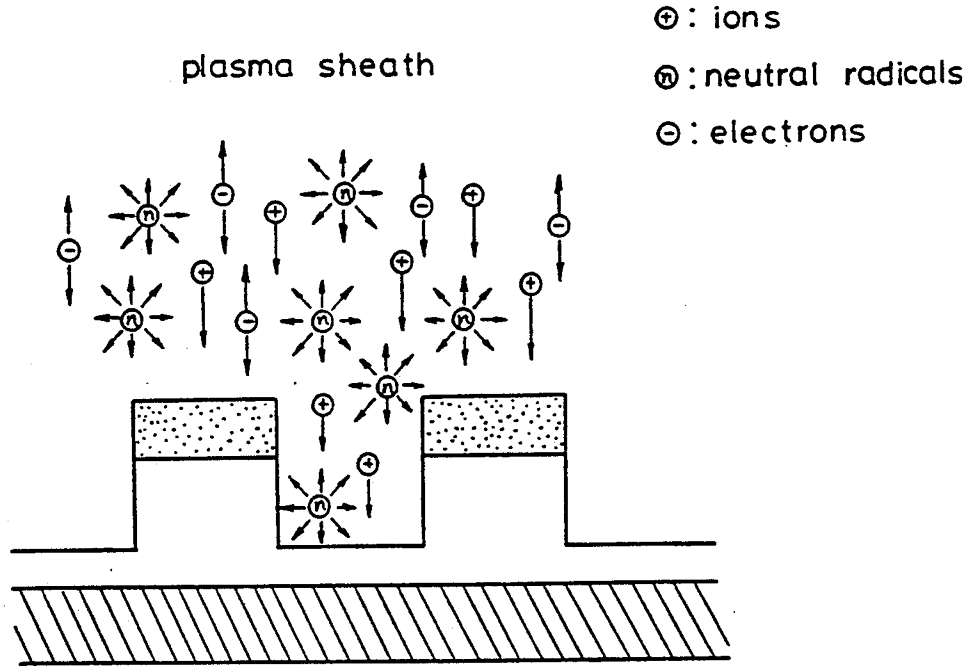
FIG. 7. (PRIOR ART)
FIG. 7 is a schematic diagram showing a manner in which plasma particles are incident on the surface of a substrate to be etched in the prior art apparatus.

As shown in FIG. 5, an RF power applying means 43 for applying RF power to the electrode 2 on which substrate to be etched 1 is mounted is provided and by generating a self bias voltage at the electrode 2, the sheath voltage (plasma potential+self bias voltage of electrode) which is produced in the neighborhood of substrate is increased. That is, when the RF power which is applied to the electrode 2 is increased by the RF power applying mean 43, the sheath voltage which is produced in the neighborhood of the substrate is increased and the acceleration due to sheath voltage of ions in to the sheath region is increased and the incident energy of ions into the surface of substrate is increased. Thereby, a physical sputtering due to ions and ion assist process etching can be carried out.

A second embodiment of the present invention will be described hereinafter.

Figure 8:
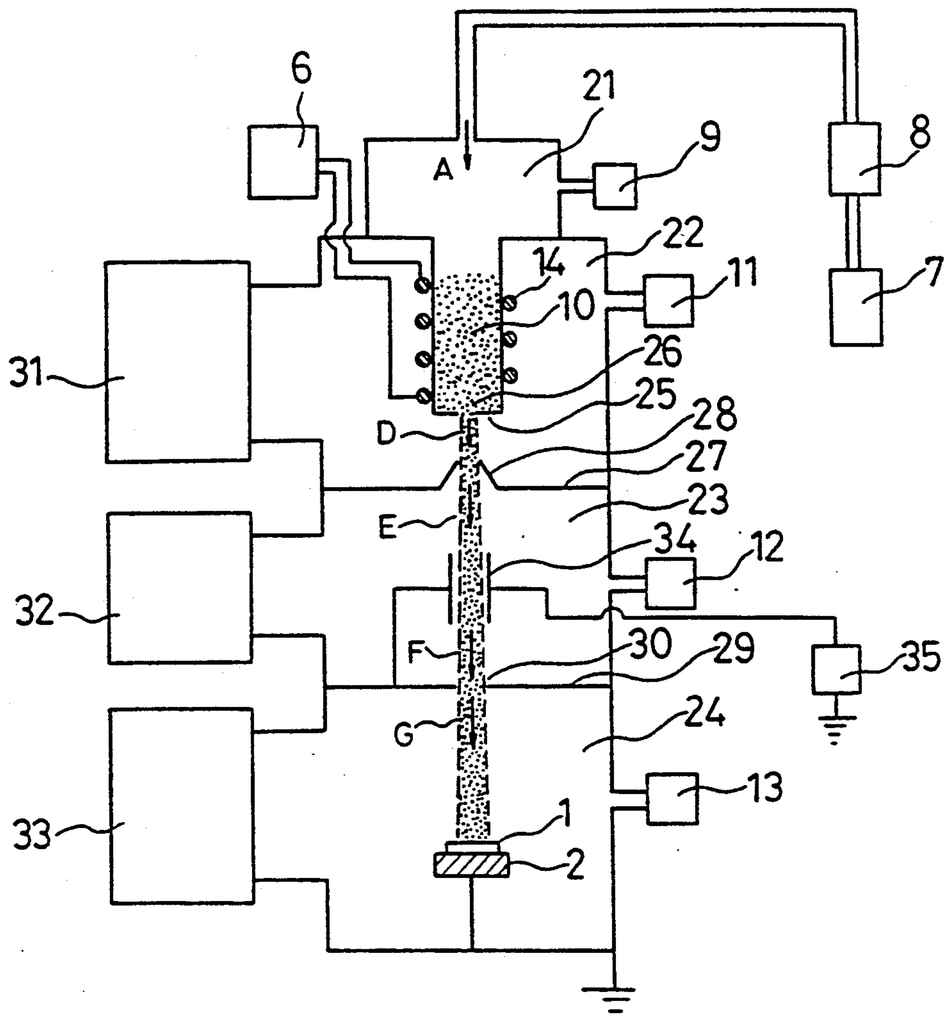
FIG. 8 is a cross-sectional view showing a construction of a dry etching apparatus according to a second embodiment of the present invention.

FIG. 8 is a cross-sectional view showing a construction of a dry etching apparatus according to a second embodiment of the present invention. In FIG. 8, the same reference numerals designate the same or corresponding portions as those shown in FIG. 1. Reference numeral 34 designates a pair of charged particle removing electrodes provided in the second vacuum room 23 for removing charged particles such as ions or electrons from the supersonic molecular flow E of plasma in the second vacuum room 23 thereby to produce supersonic molecular flow F of neutral atomic and molecular gas. Reference numeral 35 designates a DC voltage applying means for applying a voltage to between the pair of electrodes 34. A charged particle removing means is constituted by the electrodes 34 and the DC voltage applying means 35. Reference character G designates a supersonic molecular flow of chemical atomic and molecular gas flowing into the third vacuum room 24 through the collimator 30 among the supersonic molecular flow F of neutral atomic and molecular gas. The substrate to be etched 1 is disposed on the electrode 2 in the third vacuum room 24 so as to confront the supersonic molecular flow G.

A description is given of the operation.

The etching gas A is ionized in the discharge room 21 and the discharge gas is supersonically expanded to produce a supersonic free jet D in the first vacuum room 22 and the supersonic molecular flow E is extracted into the second vacuum room 23 from jet D by the skimmer 28 similarly as in the first embodiment.

A pair of charged particle removing electrodes 34 are arranged in the second vacuum room 23 on opposite sides of the supersonic molecular flow E of plasma and a voltage is applied to the pair of electrodes 34 by a DC voltage applying means 35 and an electric field is generated in a direction perpendicular to the center axis of the supersonic molecular flow E. Therefore, the ions and electrons of the supersonic molecular flow E of plasma flowing between the pair of electrodes 34 are separated and moved in opposite directions by the electric field perpendicular to the center axis of the flow of supersonic molecular flow E and are captured by the pair of electrodes 34. As a result, ions and electrons are removed from the supersonic molecular flow E of plasma which has passed through the charged particle removing electrode 34 and a supersonic molecular flow F of neutral atomic an molecular gases is produced.

In the supersonic molecular flow F of neutral atomic and molecular gas generated as described above, similarly as the supersonic molecular flow E of plasma, the gas temperature is quite low. i.e., below several degrees absolute temperature, and the thermal movement velocity of neutral atoms and molecules ar quite low and the interaction between particles can be ignored. The supersonic molecular flow F of neutral atomic and molecular gas having such characteristics is flows into the third vacuum room 24 through the collimator 30 arranged at the second partition wall 29. Here, the diameter of opening of the collimator 30 is less than approximately the diameter of the opening of the skimmer 28 similarly as in the first embodiment and the degree of vacuum in the third vacuum room 24 is kept at approximately $10^{-8}$ to $10^{-7}$ Torr and this is displayed on the third vacuum meter 13.

In the above-described third vacuum room 24, the supersonic molecular flow G of neutral atomic and molecular gas which has flowed thereinto through the collimator 30 is blown to the substrate 1 to be etched mounted on the electrode 2.

Here, since a supersonic molecular flow G of reactive neutral atomic and molecular gas which has quite low gas temperature to below several degrees in absolute temperature and has quite low thermal movement velocity of neutral atoms and molecules so that the interaction between particles can be ignored is blown to the substrate to be etched 1, the neutral atomic and molecular radicals of the reactive neutral atomic and molecular gas are incident perpendicular to the surface of substrate as a reactive particle beam of low temperature and low energy. Therefore, the velocity component perpendicular to the substrate surface of neutral atomic and molecular radicals is quite low as compared with the incident velocity parallel to the substrate, and the incident energy is quite low as compared with the physical sputtering threshold.

Figure 9:
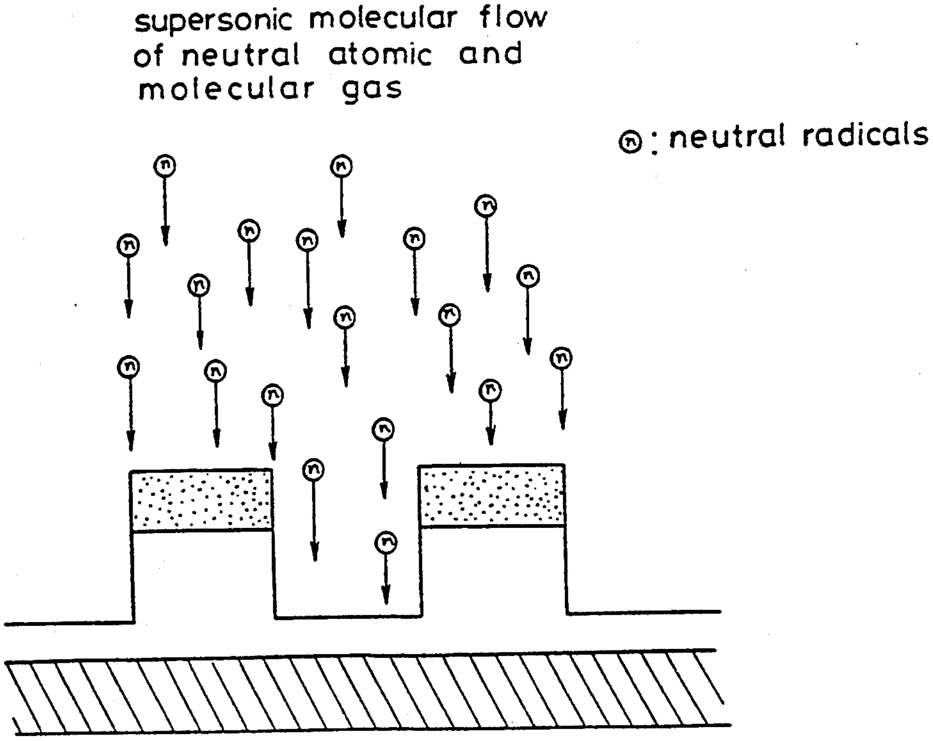
FIG. 9 is a schematic diagram showing a manner in which neutral atoms and molecules are incident on the surface of a substrate to be etched during etching in the dry etching apparatus of the second embodiment.

A mechanism of etching of the substance on substrate by the supersonic molecular flow G of neutral atomic an molecular gas in the dry etching apparatus of this second embodiment will be described with reference to FIG. 9. In this embodiment, since etching is carried out using not plasma but neutral atomic and molecular gas, a space charge region (sheath) is not produced in the neighborhood of the substrate and there is no contribution to the etching of ions. On the other hand, the neutral atomic and molecular radicals are incident perpendicular to the surface of the substrate in a state of supersonic molecular flow, the chemical etching of the substance on the substrate due to neutral radicals becomes anisotropic and not only selectivity of etching but also anisotropy of etching are achieved at the same time. Therefore, in the dry etching apparatus of this embodiment, the etching of the substance on the substrate proceeds only by the non-isotropic chemical etching due to neutral radicals and an etching that satisfies the super high selectivity, super high anisotropy and super low likelihood of damage is carried out.

Here, the supersonic molecular flow F of neutral atomic and molecular ga which is generated by removing ions and electrons from the supersonic molecular flow E of plasma includes Cl as atomic radicals and the gas density is approximately $10^{12}$ to $10^{15}$ $cm^{-3}$.

In this embodiment, the plasma 10 generated by discharge is supersonically expanded into the first vacuum room 22 through the nozzle 26 thereby to produce a supersonic free jet D of plasma and a supersonic molecular flow E of plasma having quite low gas temperature so that the interaction between heavy particles can be ignored is extracted into the second vacuum room 23 through the skimmer from the supersonic free jet D. Ions and electrons are removed from this supersonic molecular flow E of plasma by charged particle removing means thereby to produce a supersonic molecular flow F of neutral atomic and molecular gas that has quite low gas temperature and quite low thermal movement velocity of neutral atoms and molecules so that the interaction between particles can be ignored. The supersonic molecular flow F of neutral atoms and molecular gas are blown to the substrate to be etched 1 through the collimator 30, whereby the neutral atoms and molecules are incident perpendicular to the substrate as a low temperature and low energy particle beam.

In this case, the velocity component parallel to the surface of the substrate of neutral atoms and molecular radicals is quite low as compared with the perpendicular incident velocity and the incident energy is quite low as compared with the physical sputtering threshold. Therefore, the etching of the substance on the substrate proceeds only by the non-isotropic chemical etching due to neutral atomic and molecular radicals, whereby an etching that satisfies not only super high anisotropy but also super high selectivity and super low likelihood of damage is realized.

Furthermore, since the etching is carried out by using neutral atomic and molecular radicals, electrostatic destruction due to charge up of the substrate to be etched can be prevented.

In the above-illustrated second embodiment, ions and electrons of supersonic molecular flow E of plasma are removed by charged particle removing electrode 34 which are provided inside the second vacuum room 23 to produce the supersonic molecular flow F of neutral atomic and molecular gas. However, the charged particle removing electrodes 34 may be provided inside the third vacuum room 24. In this case, the supersonic molecular flow E of plasma is flows into the third vacuum room 24 through the collimator 30 and ions and electrons are removed from the supersonic molecular flow of plasma inside the third vacuum room 24 and supersonic molecular flow of neutral atomic and molecular gas is produced.

In the above-illustrated second embodiment, only an electric field is used for the charged particle removing means but both an electric field and magnetic field can be used.

Figure 10:
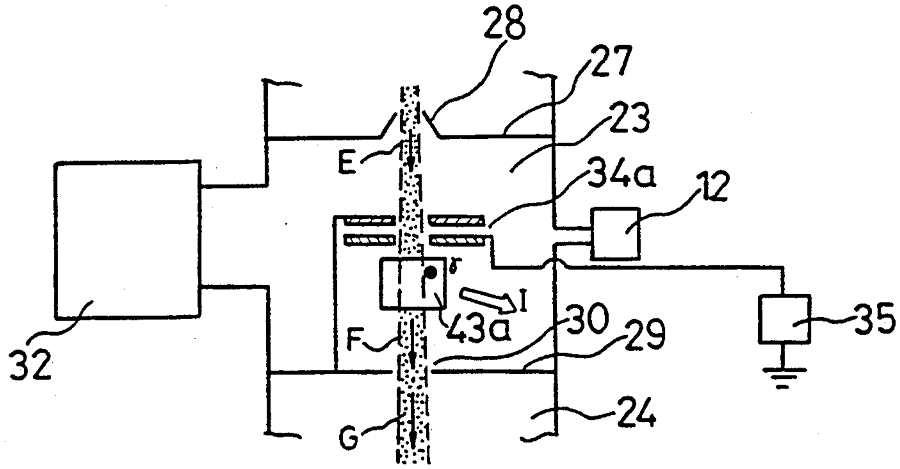
FIG. 10 is a cross-sectional view showing a construction of a charged particles removing means utilizing an electric field and a magnetic field for the removal of charged particles in the apparatus of second embodiment.

FIG. 10 shows a diagram showing a construction using an electric field and magnetic field. In this construction, a pair of electrodes 34*a* having opening at the center is provided confronting to the supersonic molecular flow E of plasma and a voltage is applied to the pair of electrodes 34*a* by a DC voltage applying means 35 and an electric field is generated in a direction parallel with the flow of the supersonic molecular flow E.

In this case, ions and electrons of supersonic molecular flow E of plasma flowing into between the pair of electrodes 34*a* are separated and moved in opposite directions by the electric field parallel with the center axis of the flow of the supersonic molecular flow and are captured by the pair of electrodes 34*a*. The charged particles which cannot be captured here are changed in direction by the magnetic field applying means 43*a* using a permanent magnet or electromagnet coil provided subsequent to the pair of electrodes 34*a* and removed from the supersonic molecular flow to produce supersonic atomic and molecular flow F of neutral atomic and molecular gas. Here, the polarity of the DC voltage applying means 35 is negative and the magnetic field by the magnetic field applying means 43*a* is $\gamma$ in a direction perpendicular to the supersonic molecular flow and I is an ion flow whose direction is changed by the magnetic field $\gamma$. Furthermore, in the above-illustrated first and second embodiments, the generation of plasma in the reactive gas discharge room 21 is carried out by a high frequency induction glow discharge using RF, that is, by inducing a high frequency current inside indirectly by such as a coil which is attached to outside the discharge room. This can be carried out by a high frequency glow discharge or arc discharge using RF or microwave, that is, in a case of RF discharge, by arranging confronting electrodes in the discharge room 21 and introducing high frequency power directly into the discharge room to generate plasma. Furthermore a construction in which plasma is generated by beam irradiation ionization discharge using an electron beam, ion beam, neutral particle beam, or laser beam can be employed.

In the above-illustrated embodiment, a mixture of $Cl_2$ and Ar is used for the etching gas A, and polycrystalline silicon on the substrate to be etched 1 is etched, but another etching gas can be used and a material to be etched other than polycrystalline silicon can be etched by an appropriate etching gas.

In the above-illustrated embodiment the frequency of the RF power applying means 6 and 43 are 13.56 MHz, but the other frequency can be used.

Furthermore, in the above-illustrated embodiment, the diameter of the opening of nozzle 26 is approximately 1 mm, but the diameter of the opening of nozzle 26 can be made larger than approximately 1 mm by increasing the exhaustion speed of the first vacuum exhaustion means 31 and further the diameter of opening of the skimmer 28 can be increased corresponding to the diameter of opening of nozzle 26 by increasing the exhaustion speed of the second vacuum exhaustion means 32.

In this case, in the above-described first embodiment apparatus, the flow flux of supersonic molecular flow E of plasma which is extracted through the skimmer 28 is increased, by increasing the diameter of the collimator 30, and by increasing the exhaustion speed of the third vacuum exhaustion means 33, the etching area and the etching speed of the substrate to be etched 1 are increased.

In the above-illustrated second embodiment apparatus, the flow flux of supersonic molecular flow E of plasma which is extracted through the supersonic molecular flow E of plasma extracted through the skimmer 28 or the flow flux of the supersonic molecular flow F of neutral atomic and molecular gas which is taken out through the charged particle removing electrodes 34 can be increased and by increasing the diameter of the collimator 30 and increasing the exhaustion speed of the third vacuum exhaustion means 33, the etching area of the substrate to be etched 1 and the etching speed are increased.

Figure 11:
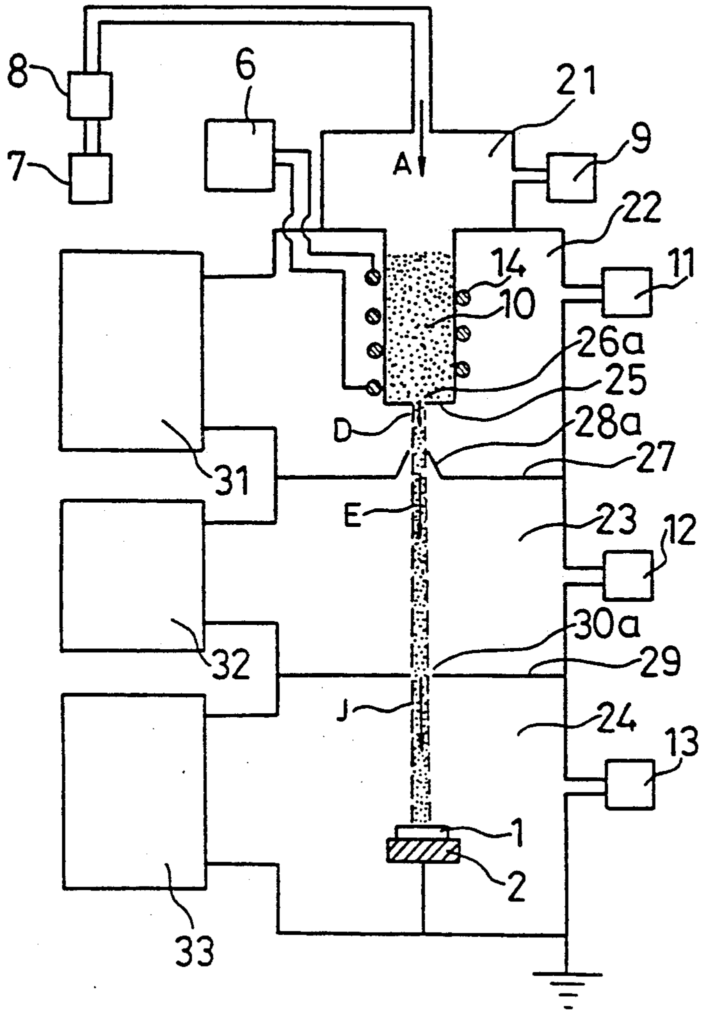
FIGS. 11(*a* ) and 11(*b*) are cross-sectional views showing a construction of a dry etching apparatus according to a third embodiment of the present invention.
Figure 11:
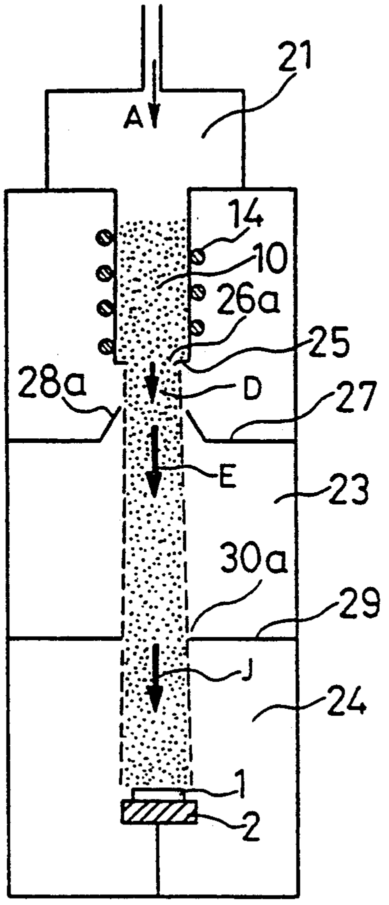

FIGS. 11(*a*) and 11(*b*) show cross-sectional views of a construction of a dry etching apparatus according to a third embodiment of the present invention. In those figures, reference numeral 21 designates a discharge room, reference numeral 22 designates a first vacuum room arranged adjacent the discharge room 21. Reference numeral 23 designates a second vacuum room arranged adjacent the first vacuum room 22. Reference numeral 24 designates a third vacuum room arranged adjacent the second vacuum room 23 and having an electrode 2 for mounting a substrate to be etched 1. Reference numeral 26*a* designates a two-dimensional nozzle having an opening whose cross-section is a rectangular slit shape provided at an end 25 of the reactive gas discharge room 21. Reference numeral 27 designates a first partition wall for partitioning the first vacuum room 22 and the second vacuum room 23. Reference numeral 28*a* designates a two-dimensional skimmer having an opening whose cross-section is of rectangular slit shape provided at the first partition wall 27. Reference numeral 29 designates a second partition wall for partitioning the second vacuum room 23 and the third vacuum room 24. Reference numeral 30*a* designates a collimator having a cross-section of rectangular slit shape provided at this second partition wall 29.

Reference numeral 31 designates a first vacuum exhaustion means for exhausting the first vacuum room 22. Reference numerals 32 and 33 designate a second and third vacuum exhaustion means for exhausting the second and third vacuum rooms 23 and 24, respectively. Reference numeral 27 designates a gas bomb containing an etching gas A which is to be supplied to the gas discharge room 21. Reference numeral 8 designates a gas flow rate control means for adjusting the flow rate of etching gas into the discharge room 21 from the gas bomb 7. Reference numeral 9 designates a pressure meter for observing the gas pressure inside the discharge room 21. Reference numerals 11 to 13 designate a first to third vacuum meters for observing the degree of vacuum inside the first to third vacuum rooms 22 to 24. Reference numeral 14 designates a high frequency induction coil provided surrounding the discharge room 21. Reference numeral 6 designates an RF power applying means for applying RF power to the coil 14.

Reference numeral 10 designates an RF induction discharge plasma generated at a portion of the discharge room 21 where the coil 14 is provided. Reference character D designates a supersonic free jet of plasma produced by the plasma 10 that supersonically is supersonic expanded into the first vacuum room 22 through the nozzle 26*a*. Reference character E designates a supersonic molecular flow of plasma extracted into the second vacuum room 23 through the skimmer 28*a* from the supersonic free jet D of plasma. Reference character J designates a supersonic molecular flow of plasma flowing into the third vacuum room 24 through the collimator 30*a* among the supersonic molecular flow E of plasma. The substrate to be etched 1 is disposed on the electrode 2 in the third vacuum room 24 confronting the supersonic molecular flow J of plasma.

The nozzle 26*a*, skimmer 28*a* and collimator 30*a* which have openings whose cross-section are of rectangular slit shape are arranged on the same plane and the supersonic free jet D in the first vacuum room 22, the supersonic molecular flow E in the second vacuum room 23, and the supersonic molecular flow J in the third vacuum room 24 are placed on the same plane as its center plane.

As a material to be etched on the substrate to be etched 1, the underlying substrate, and photoresist, polycrystalline silicon, silicon dioxide, and PMMA are respectively used similarly as in the prior art and as for the etching gas A in the gas bomb 7, a mixture gas of $Cl_2$ and Ar is used similarly as in the prior art. The frequency of the RF power applying means 6 is 13.56 MHz similarly as in the prior art.

A description is given of the operation of the dry etching apparatus of this embodiment.

First of all, exhaustion of the first to third vacuum rooms 22 to 24 are carried out by the first to third vacuum exhaustion means 31 to 33, and the reactive gas discharge room 21 and the first to third vacuum rooms 22 to 24 are set at a predetermined degree of vacuum.

Subsequently, exhaustion by the first to third vacuum exhaustion means 31 to 33 are carried out and etching gas A is introduced to the discharge room 21 through the gas flow rate control means 8 from the gas bomb 7 and further, while observing the gas pressure inside the discharge room 21 by the pressure meter 9, the etching gas flow rate is adjusted by the gas flow rate control means 8 and the gas pressure inside the discharge room 21 is thus established.

Subsequently, when RF power is applied to the high frequency induction coil 14 by an RF power applying means 6, the etching gas in the discharge room 21 is ionized by the RF induction glow discharge or arc discharge and a reactive weak ionized plasma 10 is generated. Here, the pressure in the discharge room 21 is approximately $10^2$ to $10^3$ Torr, the temperature is approximately $10^{3\circ}$ to $10^{4\circ}$ K., and the pressure is displayed by the pressure meter 9.

The plasma of etching gas A generated in the discharge room 21 is supersonically expanded into the first vacuum room 22 through the two-dimensional nozzle having an opening of cross-section of rectangular slit shape 26*a* and produces supersonic free jet D. The opening of the nozzle 26*a* is approximately $0.51\times50$ mm (longitudinal and transverse aspect ratio of 100) and the degree of vacuum in the first vacuum room 22 is held at approximately $10^{-3}$ to $10^{-2}$ Torr, and this is displayed by the first vacuum meter 11.

Figure 12:
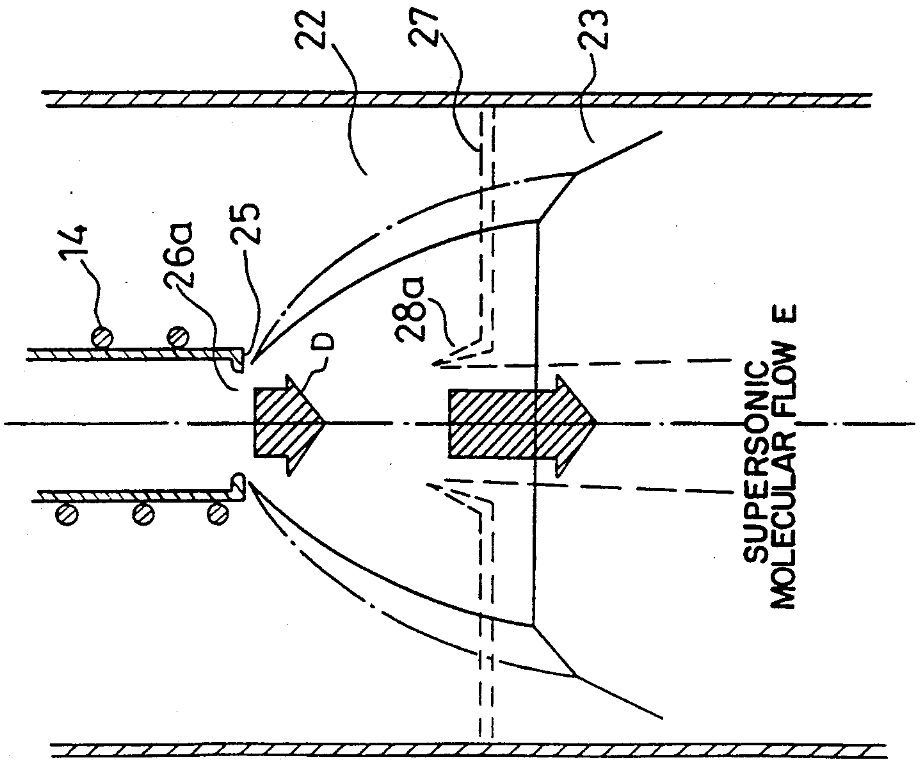
FIG. 12(*a*) is a cross-sectional view showing a detail of a supersonic free jet shown in FIG. 11.
Figure 12:
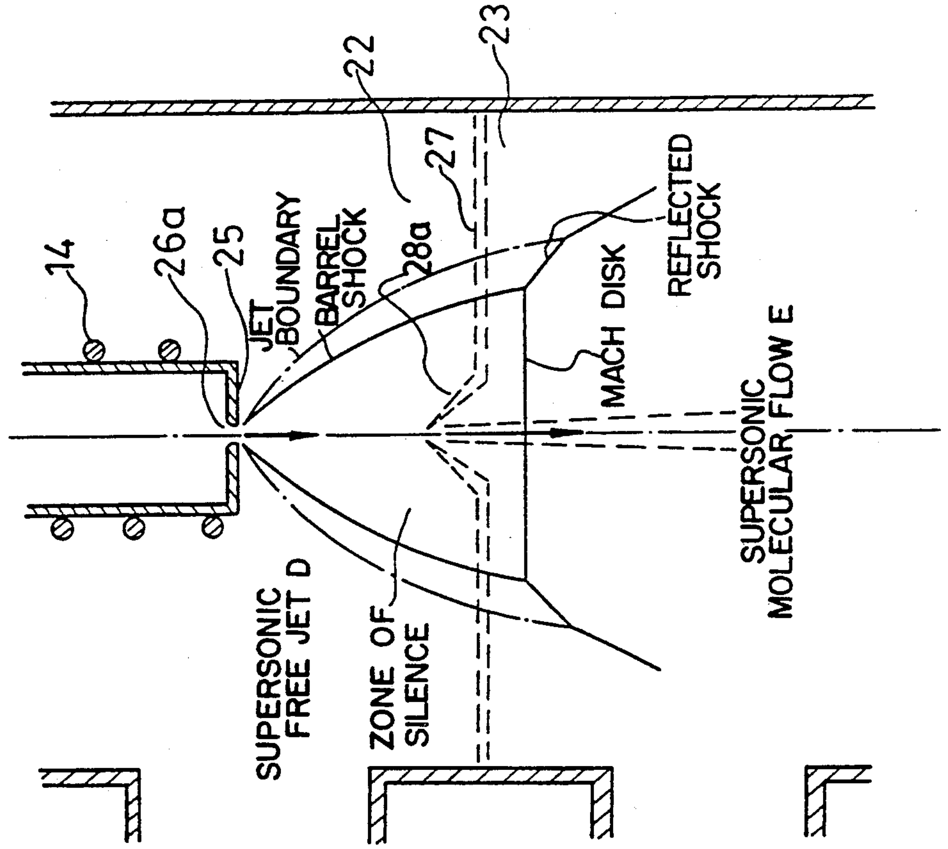

FIG. 12(*a*) and 12(*b*) show a detail of supersonic free jet D. The supersonic free jet is characterized by a region of supersonic free expansion called the "Zone of Silence" and shock waves called a "Barrel Shock" and a "Mach Disk" surrounding the Zone of Silence. There is a "Jet Boundary" surrounding the "Barrel Shock" and there is a "Reflected Shock" downstream of the "Mach Disk". In the supersonic free expansion flow in the Zone of Silence, as transiting to downstream along the center axis of the flow, the density and temperature of plasma, that is, the density and temperature of neutral atoms and molecules, ions and electrons constituting the plasma are reduced by the supersonic free expansion of gas, that is, the adiabatic expansion of gas. Therefore, the collision frequency between plasma particles is reduced and the degree of ionization is frozen at some value, but the flow velocity is increased. And, downstream by more than approximately 10 times the length of the short edge of the opening of the nozzle 26*a* from the nozzle 26*a*, the gas temperature of plasma, that is, the temperature of heavy particles such as neutral atoms and molecules and ions becomes a quite low temperature of below several degrees in absolute temperature and the collision frequency between heavy particles becomes infinitesimal. However, the electron temperature of plasma is not reduced so much as the temperature of heavy particles and it is held at approximately $10^{3\circ}$ K.

In the supersonic free jet D of plasma as above, a skimmer 28*a* having an opening whose cross-section is of rectangular slit shape is arranged at a position where the supersonic free expansion is sufficiently developed along the direction of flow thereby to sufficiently lower the gas temperature of plasma and the thermal movement velocity of heavy particles such as neutral atoms and molecules and ions are quite low such that the interaction between the heavy particles can be ignored. Concretely, the skimmer 28*a* is arranged at a first partition wall and the opening of the skimmer 28*a* has a configuration which does not give turbulence upstream of the supersonic free jet D, and the length of short edge of the opening is less than approximately two or three times the short edge of the opening of the nozzle 26*a*. A portion in the neighborhood of the center axis in the Zone of Silence of the supersonic free jet D of plasma produced in the first vacuum room 22 is extracted by such skimmer 28*a* into the second vacuum room 23 as a supersonic molecular flow E. The degree of vacuum in the second vacuum room 23 is held at approximately $10^{-6}$ to $10^{-5}$ Torr and this is displayed by the second vacuum meter 12. Furthermore, the cross-sectional configuration of the supersonic molecular flow E vertical to the flow is of rectangular slit shape.

Here, the change in the state of the supersonic free jet D of plasma, for example in the physical quantities such as gas density, temperature, and flow rate of plasma along the direction of the flow of the size of the Zone of Silence is regulated by various conditions such as the configuration and diameter of the opening of the nozzle 26, the pressure in the reactive gas discharge room 21, and the degree of vacuum in the first vacuum room 22. Therefore, in a case where supersonic molecular flow E of plasma is extracted into the second vacuum room 23 through the skimmer 28*a* from the Zone of Silence of the supersonic free jet D of plasma which is produced in the first vacuum room 22, in order to keep the extraction most appropriate in response to the change of various conditions, it is preferable to provide a mechanism which can vary the distance between the nozzle 26*a* and the skimmer 28*a* continuously.

An example of a mechanism for continuously varying the distance between the nozzle 26*a* and the skimmer 28*a* will be described with reference to FIG. 13. As shown in this figure, the discharge room 21 is connected to the first vacuum room 22 by bellows 41, and by moving the reactive gas discharge room 21 in the directions of arrows $\alpha$ and $\beta$ shown in FIG. 13 by extending and compressing the length of the bellows 41, the distance between the nozzle 26*a* and the skimmer 28*a* can be continuously varied. Therefore, it is possible to extract supersonic molecular flow E of plasma in the most appropriate manner from the supersonic free jet D of plasma whose state is varying in response to the changes of various conditions.

In the supersonic molecular flow E of plasma thus extracted into the second vacuum room 23, the gas temperature of plasma is quite low, below i.e., several degrees in absolute temperature, that is, the thermal movement velocity of heavy particles such as neutral atoms and molecules and ions is quite small and the interaction between the heavy particles can be ignored. The supersonic molecular flow E of plasma having such characteristics flows into the third vacuum room 24 through the collimator 30*a* whose cross-section is a rectangular slit shape provided at the second partition wall 29. Here, the length of the short edge of the opening of the collimator 30*a* is less than approximately the length of short edge of the opening of the skimmer 28*a* and the degree of vacuum in the third vacuum room 24 is held at approximately $10^{-8}$ to $10^{-7}$ Torr and this is displayed by the third vacuum meter 13. Since a substrate to be etched 1 is provided on an electrode 2 confronting to the supersonic molecular flow J of plasma which has flowed into the third vacuum room 24 through the collimator 30*a*, the supersonic molecular flow J of plasma is blown to the substrate to be etched 1. Furthermore the cross-sectional configuration of the supersonic molecular flow J vertical to the flow is a rectangular slit shape.

Since the supersonic molecular flow J of reactive weakly ionized plasma which has quite low gas temperature such as several degrees absolute temperature and has quite low thermal movement velocity of heavy particles such as neutral atoms and molecules and ions so that the interaction between heavy particles can be ignored is blown to the substrate to be etched 1, the ions and neutral atomic and molecular radicals of the reactive weakly ionized plasma are incident perpendicular to the surface of substrate as a low temperature and low energy reactive particle beam. Therefore, the velocity component parallel to the surface of substrate of ions and neutral atomic and molecular radicals are quite small as compared with the incident velocity in the vertical direction and the input energy is quite low as compared with the physical sputtering threshold.

Here, when a mixture of $Cl_2$ and Ar is used for the etching gas A similarly as in the prior art, Cl is generated as neutral atomic radicals, $Cl^+$ and $Ar^+$ are generated as atomic ions, and $Cl_2^+$ is generated as molecular ions. In the case of this example, there are no molecular radicals. Furthermore, the gas density of the supersonic molecular flow of plasma, that is, the density of heavy particles such as neutral atoms and molecules and ions are approximately $10^{12}$ to $10^{15}$ $cm^{-3}$ and the plasma density is approximately $10^9$ to $10^{12}$ $cm^{-3}$.

Figure 14:
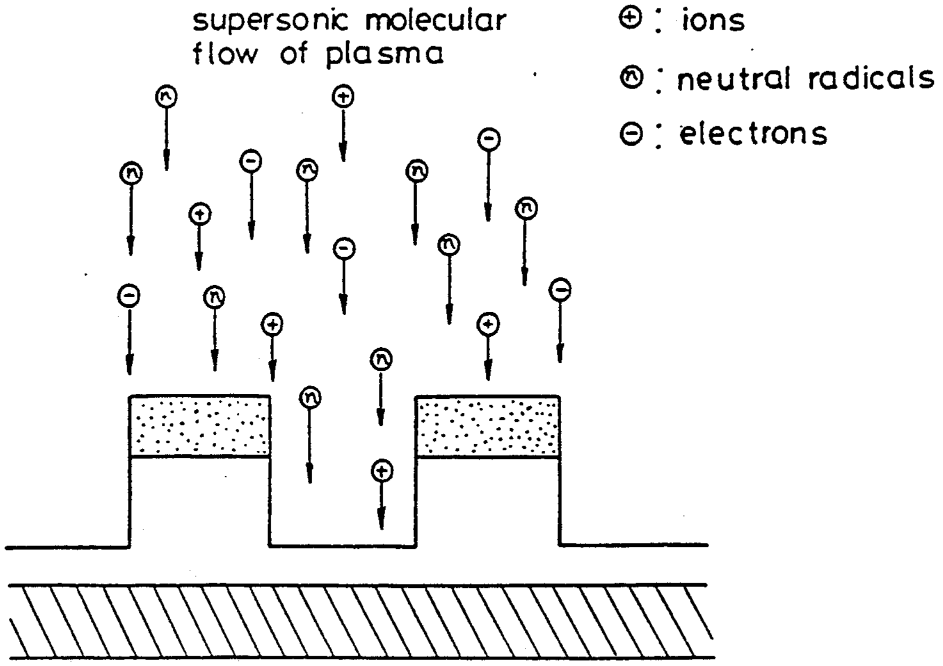
FIG. 14 is a schematic diagram showing a manner in which plasma particles are incident on the substrate to be etched in the apparatus of the third embodiment.

FIG. 14 is a schematic diagram showing a mechanism in which the substance on the substrate disposed on the electrode confronting the supersonic molecular flow of plasma is etched in a dry etching apparatus using supersonic molecular flow of plasma of this embodiment. In this case, similarly as in the prior art, a space charge region (sheath) is produced in the neighborhood of substrate and positive ions incident to the sheath region are accelerated to the substrate direction by the sheath voltage (plasma potential) of about 10 V and are incident perpendicular to the surface of the substrate.

On the other hand, the neutral radicals do not respond to the sheath voltage, but differently from the prior art, they are incident perpendicular to the surface of the substrate in a state of supersonic molecular flow. Therefore, a chemical etching due to neutral radicals which determine the selectivity of the etching becomes non-isotropic and the anisotropy of the etching is achieved at the same time.

Furthermore, the incident energy into the surface of substrate of ions is smaller than the physical sputtering threshold of about 20 eV even when accelerated by the sheath voltage and an etching due to a physical sputtering of surface of substrate by ions or by neutral radicals and ions which is called the ion assist process does not arise, and damage to the surface layer of the thin film to be etched do not arise.

After all, in the dry etching apparatus of this embodiment, the non-isotropic chemical etching due to neutral radicals controls the etching process of the substance on the substrate and an etching that satisfies not only super high anisotropy but also super high selectivity and super low likelihood of damage is carried out.

As described above, in this embodiment, the plasma 10 generated by discharge is supersonically expanded into the firs vacuum room 22 through the nozzle 26*a* thereby to produce a supersonic free jet D of plasma, and supersonic molecular flow E of plasma is extracted into the second vacuum room 23 through the skimmer 28*a* from the supersonic free jet D, and this supersonic molecular flow of plasma which has quite low gas temperature and quite low thermal movement velocity of heavy particles such as neutral atoms and molecules and ions so that the interaction between heavy particles can be ignored is blown to a substrate to be etched 1 in the third vacuum room 24 through a collimator 30*a*. Therefore, ions and neutral atoms and molecules of plasma are incident perpendicular to the surface of substrate as a low temperature and low energy particle beam. In this case the velocity component parallel to the surface of the substrate of ions and neutral radicals is quite low as compared with the incident speed in the vertical direction and the incident energy is quite low as compared with the physical sputtering threshold. As a result, a dry etching apparatus using a discharge plasma in which a non-isotropic chemical etching due to neutral radicals can realize not only super high anisotropy but also super high selectivity and super low likelihood of damage is obtained.

Figure 13:
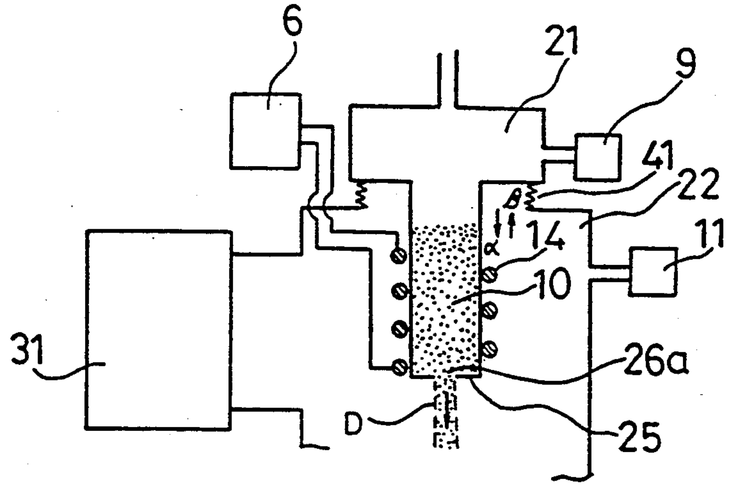
FIG. 13 is a cross-sectional view showing an example of a mechanism that varies the distance between the nozzle and skimmer continuously in the apparatus of the third embodiment.

Furthermore, in this embodiment, a mechanism for varying the distance between the nozzle 26*a* and the skimmer 28*a* continuously is provided as shown in FIG. 13, it is possible to extract the supersonic molecular flow E of plasma in a most appropriate manner from the supersonic free jet D of plasma whose state changes in response to the change of various conditions.

In the above-illustrated embodiment, the incident energy of ions and neutral radicals is lower than the physical sputtering threshold but the incident energy can be larger than the physical sputtering threshold and physical sputtering using ions can be carried out.

For example, depending on the kind of material to be etched, it is required that the incident energy into the surface of substrate of ions is made higher than the physical sputtering threshold and not only the non-isotropic chemical etching due to neutral radicals but also an etching due to a physical sputtering due to ions and an ion assist process which is a competition process of neutral radicals and ions is added. Accordingly, in order to carry out most appropriate etching in response to the various substances to be etched, it is preferable to provide means for increasing the incident energy into surface of substrate of ions independently.

Another embodiment of the present invention in which a means for increasing the incident energy of ions is provided will be described with reference to FIG. 15.

Figure 15:
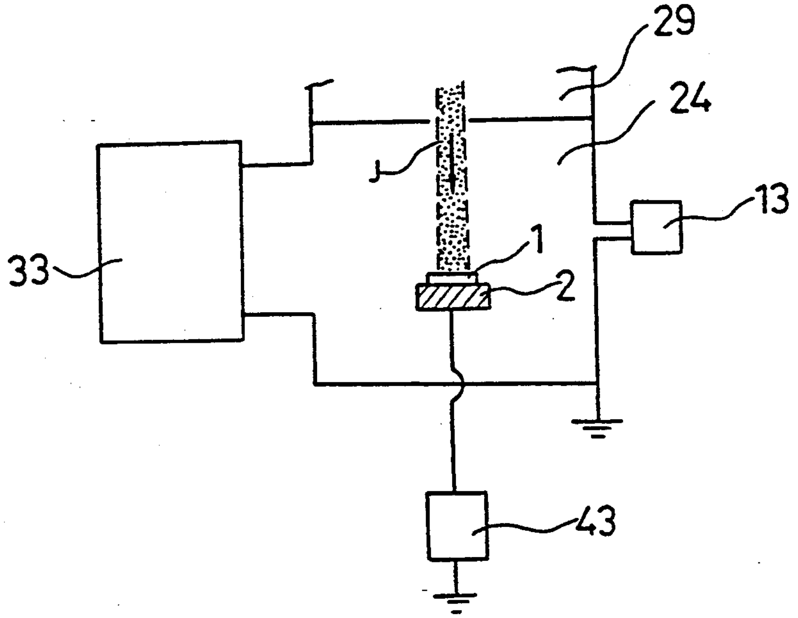
FIG. 15 is a cross-sectional view showing means for applying RF power to an electrode for mounting a substrate to be etched in the apparatus of the third embodiment.

As shown in FIG. 15, an RF electrode applying means 43 for applying RF power to the electrode 2 on which substrate to be etched 1 is mounted is provided and by generating a self bias voltage at the electrode 2, the sheath voltage (plasma potential + self bias voltage of electrode) of provided in the neighborhood of substrate is increased. That is, when the RF power which is applied to the electrode 2 is increased by the RF power applying means 43, the voltage of sheath which is produced in the neighborhood of substrate is increased and the acceleration due to sheath voltage of ions which are incident to the sheath region is increased and the incident energy of ions into the surface of substrate is increased. Thereby, not only the anisotropic chemical etching due to neutral radicals, but also an etching utilizing a physical sputtering due to ions and ion assist process etching which is a competition process of neutral radicals and ions can be carried out.

A fourth embodiment of the present invention will be described hereinafter.

Figure 16:
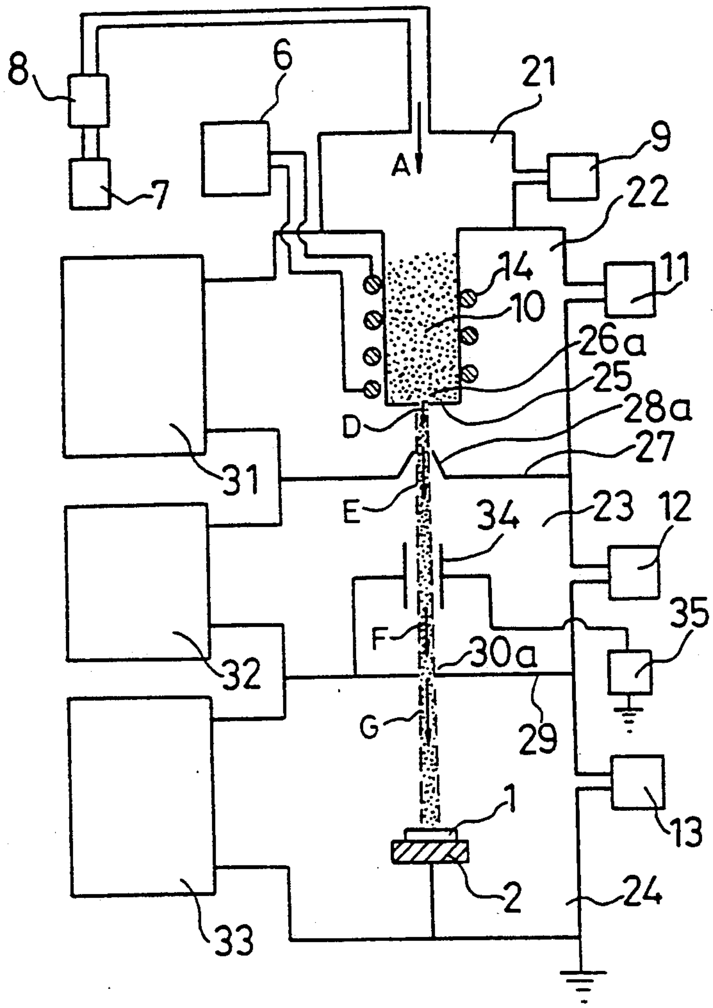
FIGS. 16(*a*) and 16(*b*) are cross-sectional views showing a construction of a dry etching apparatus according to a fourth embodiment of the present invention.
Figure 16:
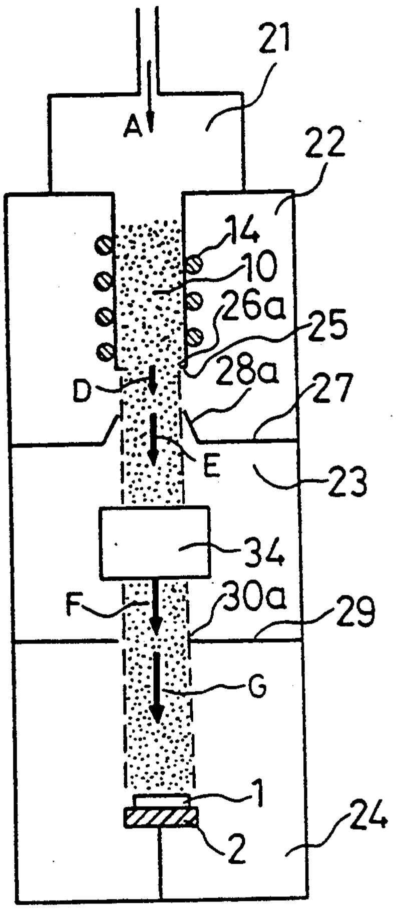

FIGS. 16(*a*) and 16(*b*) is a cross-sectional view showing a construction of a dry etching apparatus according to a fourth embodiment of the present invention. In those figures, the same reference numerals designate the same or corresponding portions as those shown in FIG. 11. Reference numeral 34 designates a pair of charged particle removing electrodes provided in the second vacuum room 23 for removing charged particles such as ions or electrons from the supersonic molecular flow E of plasma in the second vacuum room 23 thereby to produce supersonic molecular flow F of neutral atomic and molecular gas. Reference numeral 35 designates a DC voltage applying means for applying a voltage to the pair of electrodes 34. A charged particle removing means is constituted by the electrodes 34 and the DC voltage applying means 35. Reference character G designates a supersonic molecular flow of chemical atomic and molecular gas flowing into the third vacuum room 24 through the collimator 30a among the supersonic molecular flow F of neutral atomic and molecular gas. The substrate to be etched 1 is disposed on the electrode 2 in the third vacuum room 24 so as to confront the supersonic molecular flow G.

A description is given of the operation.

The etching gas A is ionized in the discharge room 21 and the discharge gas is supersonically expanded to produce a supersonic free jet D in the first vacuum room 22 through a two-dimensional nozzle 26a having an opening whose cross-section is a rectangular slit shape, and the supersonic molecular flow E having a cross-section of rectangular slit shape in a direction perpendicular to the flow is extracted into the second vacuum room 23 from jet D by the two-dimensional skimmer 28a having an opening whose cross-sectional is a rectangular slit shape similarly as in the first embodiment.

A pair of charged particle removing electrodes 34 are arranged in the second vacuum room 23 on opposite sides of the supersonic molecular flow E of plasma and a voltage is applied to the pair of electrodes 34 by a DC voltage applying means 35 and an electric field is generated in a direction perpendicular to the flow direction of the supersonic molecular flow E. Therefore, the ions and electrons of the supersonic molecular flow E of plasma flowing between the pair of electrodes 34 are separated and moved in opposite directions by the electric field flow direction of supersonic molecular flow E and are captured by the pair of electrodes 34. As a result, ions and electrons are removed from the supersonic molecular flow E of plasma which has passed through the charged particle removing electrodes 34 and supersonic molecular flow F of neutral atomic and molecular gas are taken out. Here, the cross-sectional configuration of the supersonic molecular flow F vertical to the flow is of rectangular slit shape.

In the supersonic molecular flow F of neutral atomic and molecular gas generated as described above, similarly as the supersonic molecular flow E of plasma, the gas temperature is quite low, i.e., several degrees in an absolute temperature, and the thermal movement velocity of neutral atoms and molecules is quite low and the interaction between particles can be ignored. The supersonic molecular flow F of neutral atomic and molecular gas having such characteristics flows into the third vacuum room 24 through the collimator 30a of cross-section of rectangular slit shape arranged at the second partition wall 29. Here, the length of the short edge of opening of the collimator 30a is less than approximately the length of the short edge of the opening of the skimmer 28a similarly as in the first embodiment and the degree of vacuum in the third vacuum room 24 is kept at approximately $10^{-8}$ to $10^{-7}$ Torr and this is displayed on the third vacuum meter 13.

In the above-described third vacuum room 24, the supersonic molecular flow 6 of neutral atomic and molecular ga which has flown thereinto through the collimator 30a is vertically blown to the substrate to be etched 1 mounted on the electrode 2. Here, the cross-sectional configuration of the supersonic molecular flow G vertical to the flow is a rectangular slit shape.

As described above, since a supersonic molecular flow G of reactive neutral atomic and molecular gas which has quite low gas temperature, i.e., below several degrees in absolute temperature, and has quite low thermal movement velocity of neutral atoms end molecules so that the interaction between particles can be ignored is blown to the substrate to be etched 1, the neutral atomic and molecular radicals of the reactive neutral atomic and molecular gas are incident perpendicular to the surface of the substrate as a reactive particle beam of low temperature and low energy. Therefore, the velocity component parallel to the substrate surface of neutral atomic and molecular radicals is quite low as compared with the incident velocity of vertical direction, and the incident energy is quite low as compared with the physical sputtering threshold.

Figure 17:
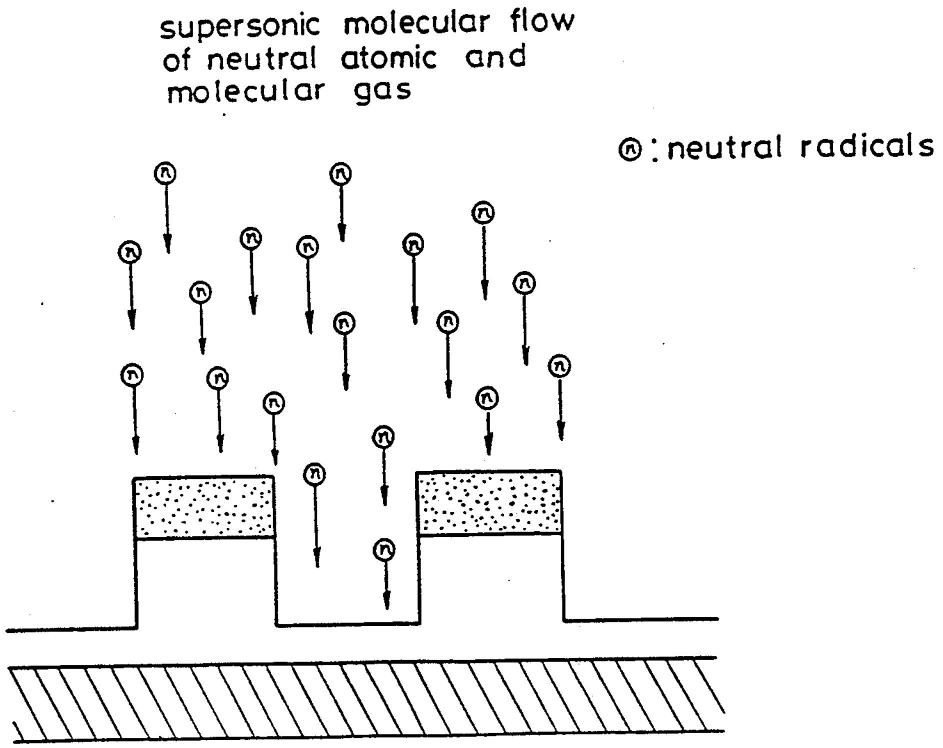
FIG. 17 is a schematic diagram showing a manner in which neutral atoms and molecules are incident on a substrate to be etched in the apparatus of the fourth embodiment.

A mechanism of etching of the substance on the substrate arranged confronting the supersonic molecular flow of neutral atomic and molecular gas in the dry etching apparatus of this fourth embodiment will be described with reference to FIG. 17. In this embodiment, since etching is carried out using not plasma but neutral atomic and molecular gas, a space charge region (sheath) is not produced in the neighborhood of substrate and there is no contribution to the etching of ions. On the other hand, the neutral atomic and molecular radicals are vertically incident on the surface of substrate in a state of supersonic molecular flow, the chemical etching of the substance on the substrate due to neutral radicals becomes anisotropic and not only selectivity of etching but also anisotropy of etching are achieved at the same time. Therefore, in the dry etching apparatus of this embodiment, the etching of the substance on the substrate proceeds only by the non-isotropic chemical etching due to neutral radicals and an etching that satisfies not only the super high anisotropy but also the super high selectivity and super low likelihood of damage is carried out.

Here, the supersonic molecular flow F of neutral atomic and molecular gas which is generated by removing ions and electrons from the supersonic molecular flow E of plasma includes Cl as atomic radicals and the gas density is approximately $10^{12}$ to $10^{15}$ $cm^{-3}$.

In this embodiment, the plasma 10 generated by discharge is supersonically expanded into the first vacuum room 22 through the nozzle 26a thereby to produce a supersonic free jet D of plasma and a supersonic molecular flow E of plasma having quite low gas temperature so that the interaction between heavy particles can be ignored is extracted into the second vacuum room 23 through the skimmer 28a from the supersonic free jet D, and further ions and electrons are removed from this supersonic molecular flow E of plasma by charged particle removing means thereby to produce supersonic molecular flow F of neutral atomic and molecular gas that has quite low gas temperature and quite low thermal movement velocity of neutral atoms and molecules so that the interaction between particles can be ignored, and the supersonic molecular flow F of neutral atoms and molecular gas are blown to the substrate to be etched 1 through the collimator 30a, whereby the neutral atoms and molecules are incident perpendicular to the substrate as a low temperature and low energy particle beam.

In this case, the velocity component parallel to with the surface of the substrate of neutral atoms and molecular radicals is quite low as compared with the incident velocity of vertical direction, and the incident energy is quite low as compared with the physical sputtering threshold. Therefore, the etching of the substance on the substrate proceeds only by the non-isotropic chemical etching due to neutral atomic and molecular radicals, whereby etching that satisfies not only super high anisotropy but also super high selectivity and super low likelihood of damage is realized.

Furthermore, since the etching is carried out by using neutral atomic and molecular radicals, electrostatic destruction due to charging of substrate to be etched can be prevented.

In the above-illustrated fourth embodiment, ions and electrons of supersonic molecular flow E of plasma are removed by charged particle removing electrodes 34 which are provided inside the second vacuum room 23 to produce the supersonic molecular flow F of neutral atomic and molecular gas. However, the charged particle removing electrodes 34 can be provided inside the third vacuum room 24. In this case, the supersonic molecular flow E of plasma flows into the third vacuum room 24 through the collimator 30*a* and ions and electrons are removed from the supersonic molecular flow of plasma inside the third vacuum room 24 and a supersonic molecular flow of neutral atomic and molecular gas is produced.

In the above-illustrated fourth embodiment, an electric field is used for the charged particle removing means, but both an electric field and magnetic field can be used.

Figure 18:
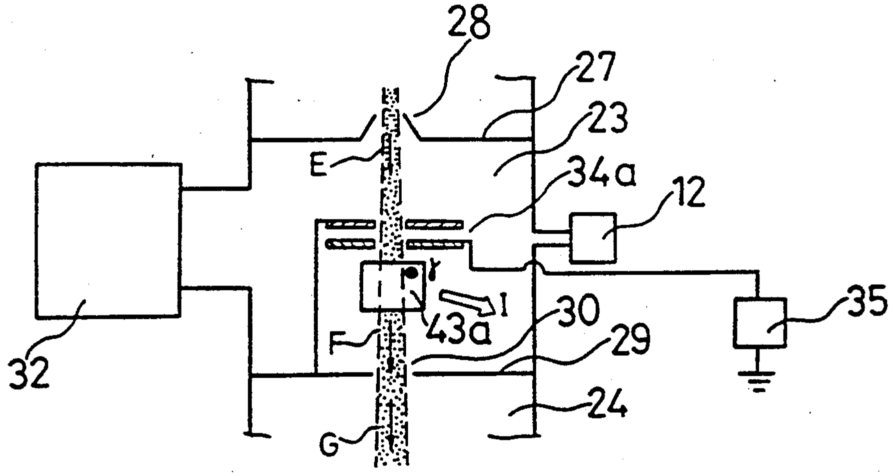
FIG. 18 is a cross-sectional view showing the removal of charged particles carried out by using an electric field and a magnetic field in the apparatus of the fourth embodiment.

FIG. 18 shows a construction using electric field and magnetic field. In this construction, a pair of electrodes 34*a* having openings at the center is provided confronting to the supersonic molecular flow E of plasma and a voltage is applied to the pair of electrodes 34*a* by a DC voltage applying means 35 and an electric field is generated in a direction parallel with the flow of the supersonic molecular flow E.

In this case, ions and electrons of supersonic molecular flow E of plasma flow between the pair of electrodes 34*a* and are separated and moved in opposite directions by the electric field parallel with the flow direction of the supersonic molecular flow and are changed in direction by the magnetic field applying means 43*a* using a permanent magnet or electromagnet coil provided subsequent to the pair of electrodes 34*a* and removed from the supersonic molecular flow to produce supersonic atomic and molecular flow F of neutral atomic and molecular gas. Here, the polarity of the DC voltage applying means 35 is negative, the direction of magnetic field by the magnetic field applying means 43*a* is $\gamma$ perpendicular to the supersonic molecular flow, and I is an ion flow whose direction is changed by the magnetic field $\gamma$.

A fifth embodiment of the present invention will be described hereinafter.

Figure 19:
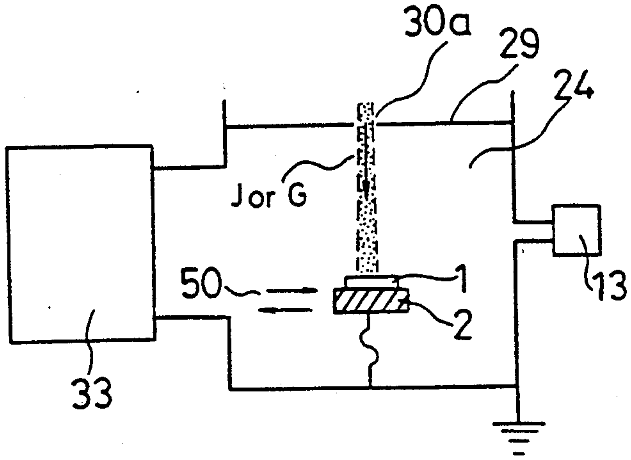
FIGS. 19(*a*) and 19(*b*) are cross-sectional views showing a substrate being etched that is moved with respect to the supersonic molecular flow according to a fifth embodiment of the present invention.
Figure 19:
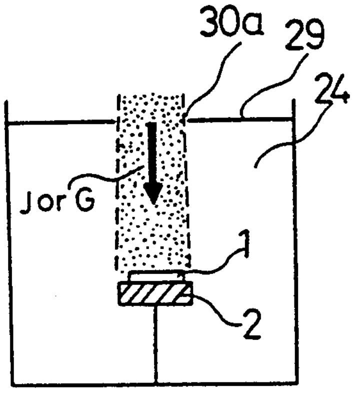

FIGS. 19(*a*) and 19(*b*) are cross-sectional views showing a portion in the neighborhood of the substrate to be etched 1 in a dry etching apparatus according to a fifth embodiment of the present invention. In those figures, the same reference numerals designate the same or corresponding portions as those shown in FIGS. 11 and 16. Reference numeral 50 designates a direction along which the position of the substrate to be etched 1 is moved with respect to the supersonic molecular flow J of plasma or the supersonic molecular flow G of neutral atomic and molecular gas during the etching.

A description is given of an operation.

In the third and fourth embodiments of the present invention, the plasma generated in the discharge room 21 is supersonically expanded into the first vacuum room 22 through the two-dimensional nozzle 26*a* having an opening whose cross-section is a rectangular slit shape thereby to produce a supersonic free jet D of plasma. Supersonic molecular flow E of plasma is extracted into the second vacuum room 23 through the two-dimensional skimmer 28*a* having an opening whose cross-section is a rectangular slit shape from the supersonic free jet D. The supersonic molecular flow E becomes a sheet shaped beam whose cross-sectional configuration perpendicular to the flow is of rectangular slit shape. Accordingly, as for the supersonic molecular flow J of plasma which flows into the third vacuum room 24 through the collimator 30*a* whose cross-sectional configuration is of rectangular slit shape, or the supersonic molecular flow G of neutral atomic and molecular gas which flows into the third vacuum room 24 through the charged particle removing electrodes 34 and the collimator 30*a*, the cross-sectional configurations thereof perpendicular to the flow are of rectangular slit shape. Accordingly, by moving the position of the substrate to be etched 1 in the short edge direction 50 during the etching, an etching that satisfies super high anisotropy, super high selectivity, and super low likelihood of damage is possible for a large sized substrate. Herein, the size of the substrate 1 which can be etched is approximately the length of the cross-section in the long edge direction perpendicular to the flow of the supersonic molecular flow J of plasma as a sheet beam or the flow of the supersonic molecular flow G of neutral atomic or molecular gas, or approximately the length of the opening in the long edge direction of the two-dimensional nozzle 26*a* and two-dimensional skimmer 28*a* whose cross-sections are rectangular slits.

Furthermore, in the above-illustrated third to fifth embodiments, the generation of plasma in the reactive gas discharge room 21 is carried out by a high frequency induction glow discharge using RF or an arc discharge, that is, by inducing a high frequency current inside indirectly by a coil which is attached to the outside the discharge room. This can be carried out by a high frequency glow discharge or arc discharge using RF or microwave, that is, in a case of RF discharge, by arranging confronting electrodes or an antenna in the discharge room 21 thereby to introduce high frequency power directly into the discharge room to generate plasma. Furthermore a construction in which plasma is generated by beam irradiation ionization discharge using such as electron beam, ion beam, neutral particle beam, or laser beam may be employed.

In the above-illustrated embodiment, a mixture of $Cl_2$ and Ar is used for the etching gas A, and polycrystalline silicon on the substrate to be etched 1 is etched, but the other etching gases can be used and a material to be etched other than polycrystalline silicon can be etched by an appropriate etching gas.

In the above-illustrated embodiment the frequency of the RF power applying means 6 and 43 are 13.56 MHz, but another frequency can be used.

Furthermore, in the above-illustrated embodiment, the size of the opening of nozzle 26*a* is approximately 0.5×50 mm (aspect ratio 100), but the size of the opening of nozzle 26*a* can be made larger by increasing the exhaustion speed of the first vacuum exhaustion means 31 and further the size of opening of the skimmer 28*a* can be increased corresponding to the size of opening of nozzle 26*a* by increasing the exhaustion speed of the second vacuum exhaustion means 32.

In this case, in the above-described third embodiment, the flow flux of supersonic molecular flow E of plasma which is extracted through the skimmer 28*a* is increased and by increasing the diameter of the collimator 30*a* by increasing the exhaustion speed of the third vacuum exhaustion means 33, the etching area and the etching speed of the substrate to be etched 1 are increased.

In the above-illustrated fourth embodiment, the flow flux of supersonic molecular flow E of plasma which is extracted through the supersonic molecular flow E of plasma extracted through the skimmer 28*a* or the flow flux of the supersonic molecular flow F of neutral atomic and molecular gas which is taken out through the charged particle removing electrodes 34 can be increased by increasing the diameter of the collimator 30*a*, and by increasing the exhaustion speed of the third vacuum exhaustion means 33, the etching area of the substrate to be etched 1 and the etching speed are increased.

Furthermore, in the fifth embodiment, the aspect ratio of apertures of the two-dimensional nozzle 26 and two-dimensional skimmer 28*a* whose cross-sections are a rectangular slit shape can be increased. By that the long edges of the apertures are lengthened and the position of the substrate to be etched 1 is moved in the short edge direction relative to the supersonic molecular flow J or G whose cross-sectional configuration vertical to the flow is a rectangular slit shape during etching, and etching of a larger sized substrate can be realized.

Figure 20:
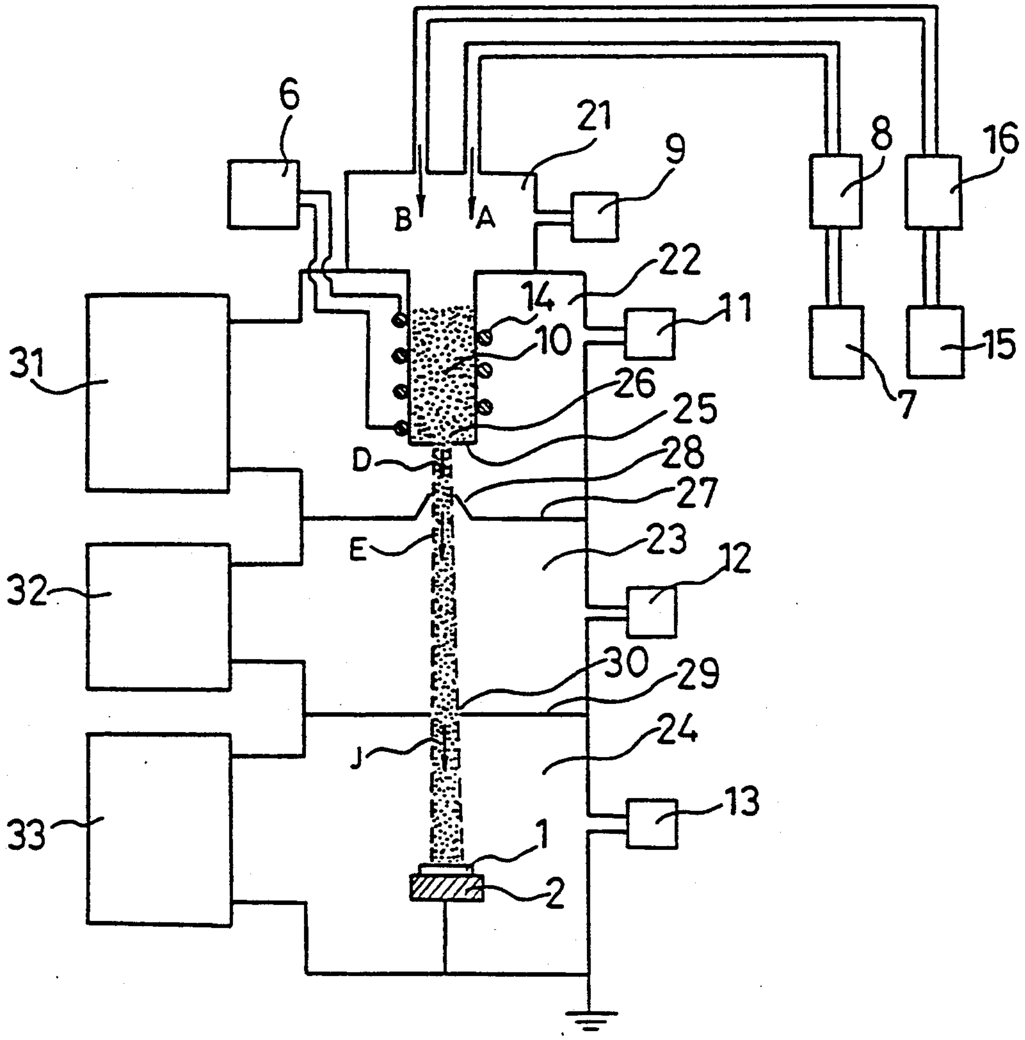
FIG. 20 is a cross-sectional view showing a construction of a dry etching apparatus according to a sixth embodiment of the present invention.

FIG. 20 shows a cross-sectional view showing a main part of a construction of a dry etching apparatus according to a sixth embodiment of the present invention. In figure 20, reference numeral 21 designates a discharge room, reference numeral 22 designates a first vacuum room arranged adjacent the discharge room 21. Reference numeral 23 designates a second vacuum room arranged adjacent the first vacuum room 22. Reference numeral 24 designates a third vacuum room arranged adjacent the second vacuum room 23 and having an electrode 2 for mounting a substrate to be etched 1. Reference numeral 26 designates a nozzle provided at an end of the reactive gas discharge room 21. Reference numeral 27 designates a first partition wall for partitioning the first vacuum room 22 and the second vacuum room 23. Reference numeral 28 designates a skimmer provided at the first partition wall 27. Reference numeral 29 designates a second partition wall for partitioning the second vacuum room 23 and the third vacuum room 24. Reference numeral 30 designates a collimator provided at this second partition wall 29.

Reference numeral 31 designates a first vacuum exhaustion means for exhausting the first vacuum room 22. Reference numerals 32 and 33 designate a second and third vacuum exhaustion means for exhausting the second and third vacuum rooms 23 and 24, respectively. Reference numeral 7 designates a first gas bomb containing etching gas A which is to be supplied to the gas discharge room 21. Reference numeral 8 designates a first ga flow rate control means for adjusting the flow rate of etching gas into the discharge room 21 from the first gas bomb 7. Reference numeral 15 designates a second gas bomb containing light element gas B which is to be supplied to the gas discharge room 21. Reference numeral 16 designates a second gas flow rate control means for adjusting the flow rate of light element gas into the discharge room 21 from the gas bomb 15. Reference numeral 9 designates a pressure meter for observing the gas pressure inside the discharge room 21. Reference numerals 11 to 13 designate a first to third vacuum meters for observing the degree of vacuum inside the first to third vacuum rooms 22 to 24. Reference numeral 14 designates a high frequency induction coil provided surrounding the discharge room 21. Reference numeral 6 designates an RF power applying means for applying RF power to the coil 14.

Reference numeral 10 designates an RF induction discharge plasma generated at a portion of the discharge room 21 where the coil 14 is provided. Reference character D designates a supersonic free jet of plasma produced when the plasma 10 is supersonically expanded into the first vacuum room 22 through the nozzle 26. Reference character E designates a supersonic molecular flow of plasma extracted into the second vacuum room 23 through the skimmer 28 from the supersonic free jet D of plasma. Reference character J designates a supersonic molecular flow of plasma flowing into the third vacuum room 24 through the collimator 30 among the supersonic molecular flow E of plasma. The substrate to be etched 1 is disposed on the electrode 2 in the third vacuum room 24 confronting the supersonic molecular flow J of plasma.

The nozzle 26, skimmer 28 and collimator 30 are arranged on a straight line on the same axis as the center axis of the supersonic free jet D in the first vacuum room 22, the supersonic molecular flow E in the second vacuum room 23, and the supersonic molecular flow J in the third vacuum room 24.

As a material to be etched on the substrate to be etched 1, the underlying substrate, and photoresist, polycrystalline silicon, silicon dioxide, and PMMA are respectively used similarly as in the prior art, and as for the etching gas A in the gas bomb 7, $Cl_2$ is used similarly as in the prior art. The frequency of the RF power applying means 6 is 13.56 MHz similarly as in the prior art.

As for the light element gas B in the second gas bomb 15, helium is used.

A description is given of the operation of the dr etching apparatus of this embodiment.

First of all, exhaustion of the first to third vacuum rooms 22 to 24 are carried out by the first to third vacuum exhaustion means 31 to 33, and the reactive gas discharge room 21 and the first to third vacuum rooms 22 to 24 are set at a predetermined degree of vacuum. Subsequently, exhaustion by the first to third vacuum exhaustion means 31 to 33 is carried out and etching gas A is introduced to the discharge room 21 through the first gas flow rate control means 8 from the first gas bomb 7 and further light element gas B is introduced thereto through the second gas flow rate control means 16 from the second gas bomb 15. While observing the gas pressure inside the discharge room 21 by the pressure meter 9, the etching gas flow rate is adjusted by the first gas flow rate control means 8 and the light element gas flow rate is adjusted by the second ga flow rate control means 16, whereby the gas pressure inside the discharge room 21 is established.

Subsequently, when RF power is applied to the high frequency induction coil 14 by an RF power applying means 6, the mixture of etching gas and light element gas in the discharge room 21 is ionized by the RF induction glow discharge or arc discharge and a reactive weakly ionized plasma 10 is generated. Here, the pressure in the discharge room 21 is approximately $10^2$ to $10^3$ Torr, the temperature is approximately $10^{3°}$ to $10^{4°}$ K., and the pressure is displayed by the pressure meter 9.

The plasma of the mixed gas of etching gas A and light element gas B generated in the discharge room 21 is supersonically expanded into the first vacuum room 22 through the nozzle 26 and produces supersonic free jet D. The opening of the nozzle 26 is approximately 1 mm in diameter and the degree of vacuum in the first vacuum room 22 is held at approximately $10^{-3}$ to $10^{-2}$ Torr, and this is displayed by the first vacuum meter 11.

Figure 21:
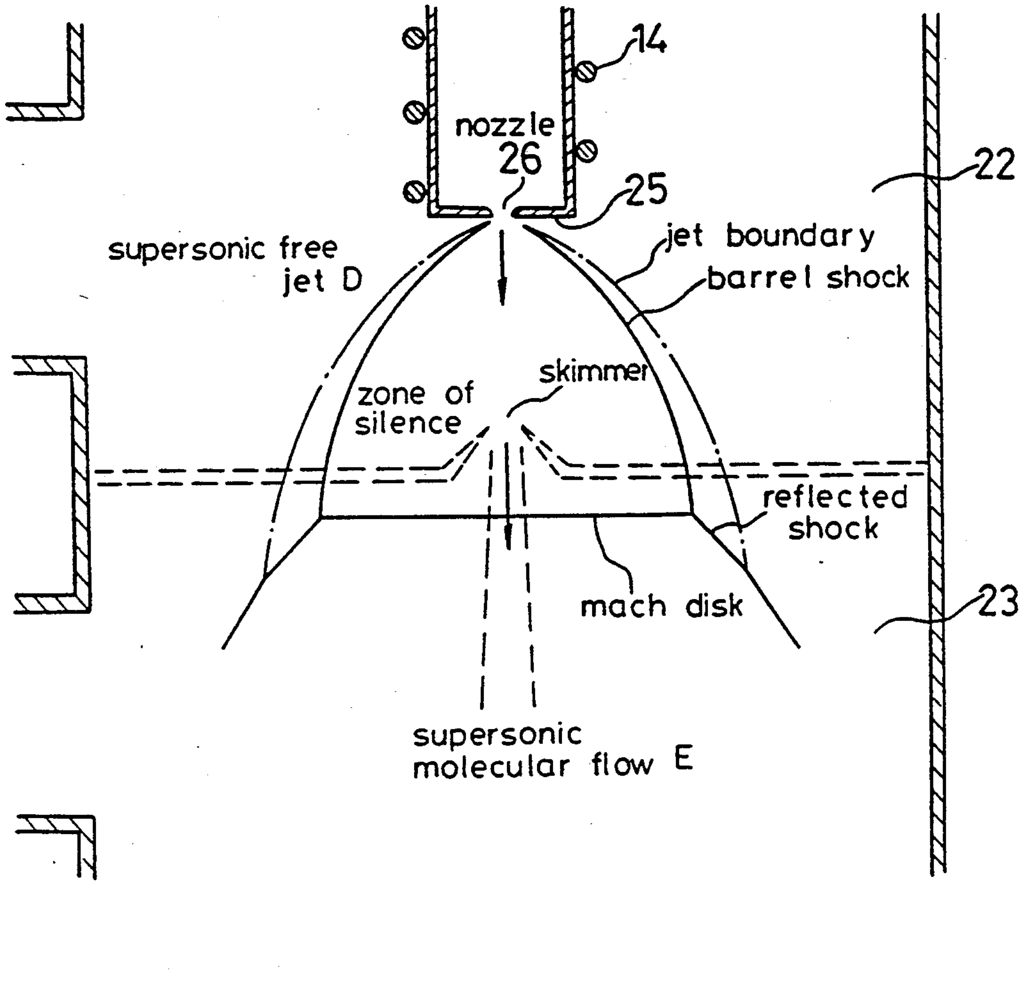
FIG. 21 is a cross-sectional view showing a detail of the supersonic free jet shown in FIG. 20.

FIG. 21 shows a detail of supersonic free jet D. The supersonic free jet is characterized by a region of supersonic free expansion called the "Zone of Silence" and shock waves called "Barrel Shock" and "Mach Disk" surrounding the Zone of Silence. There is a "Jet Boundary" surrounding the "Barrel shock" and there is a "Reflected Shock" downstream of the "Mach Disk". In the supersonic free expansion flow in the Zone of Silence, downstream along the center axis of the flow, the density and temperature of plasma, that is, the density and temperature of neutral atoms and molecules, ions and electrons constituting the plasma are reduced by the supersonic free expansion of gas, that is, the adiabatic expansion of gas. Therefore, the collision frequency between plasma particles is reduced and the degree of ionization is frozen at some value, but the flow velocity is increased. And, downstream by more than approximately 10 times of the length of short edge of the opening of the nozzle 26 from the nozzle 26, the gas temperature of plasma, that is, the temperature of heavy particles such as neutral atoms and molecules and ions becomes quite low, i.e., below several degrees absolute temperature and the collision frequency between heavy particles becomes infinitesimal. However, the electron temperature of plasma is not reduced so much as the temperature of heavy particles and it is held at approximately $10^{3°}$ K.

FIGS. 22(*a*), 22(*b*) and 22(*c*) show characteristics of the flow in the Zone of Silence of supersonic free jet D with respect to single atomic molecular gas. In the supersonic free expansion flow which is expanded into the first vacuum room 22 from the discharge room 21 wherein the gas temperature is kept at $T_0$ through the nozzle 26, to downstream along the center axis of the flow, the gas temperature T is lowered and the flow velocity u is increased. In this case, when conservation of Enthalpy is considered, the upper limit of the kinetic energy $\frac{1}{2}.Mu^2$ with respect to the velocity u is $\frac{1}{2}.5\ kT_0$, and the upper limit of the velocity u is $(5\ kT_0/M)^{\frac{1}{2}}$. Here, M is atomic mass and k is Boltzmann's constant. When the light element gas He is compared with, for example, Ar, the upper limit velocity of He $(5\ kT_0/M_{He})^{\frac{1}{2}}$ is approximately three times of the upper limit velocity of Ar $(5\ kT_0/M_{Ar})^{\frac{1}{2}}$ when the temperature $T_0$ is same. Furthermore, when a mixture of reactive gas and He or Ar is considered, when the mixed ratio of reactive gas and He or Ar is below approximately 5%, at the Zone of Silence of the supersonic free jet D, the flow velocity of the reactive gas with respect to atoms and molecules is approximately equal to the flow velocity of the reactive gas with respect to He or Ar.

Accordingly, when the supersonic free expansion is performed using the mixed reactive gas and light element gas He, the flow velocity with respect to the reactive gas atoms and molecules is about three times as high as that in a case of mixing with Ar.

In the supersonic free jet D of plasma, a skimmer 28 is arranged at a position where the supersonic free expansion is sufficiently developed along the center axis of flow thereby to sufficiently lower the gas temperature of plasma and the thermal movement velocity of heavy particles such as neutral atoms and molecules and ions are such that the interaction between heavy particles can be ignored. Concretely, the skimmer 28 is arranged at a first partition wall 27 and the opening of the skimmer 28 has a configuration which does not give turbulence upstream of the supersonic free jet D, and the size of the opening is less than approximately two or three times of the size of the nozzle 26. A portion in the neighborhood of the center axis in the Zone of Silence of the supersonic free jet of plasma produced in the first vacuum room 22 is extracted by such skimmer 28 into the second vacuum room 23 as a supersonic molecular flow E. The degree of vacuum in the second vacuum room 23 is held at approximately $10^{-6}$ to $10^{-5}$ Torr and this is displayed by the second vacuum meter 12.

Here, the change in the state of the supersonic free jet D of plasma, that is, in a physical quantity such as gas density, temperature, and flow rate of plasma along the center axis of the flow of the size of the Zone of Silence is regulated by the configuration and size of opening of the nozzle 26, the pressure in the reactive gas discharge room 21, and the degree of vacuum in the first vacuum room 22. Therefore, in a case where supersonic molecular flow E of plasma is extracted into the second vacuum room 23 through the skimmer 28 from the Zone of Silence of the supersonic free jet D of plasma produced in the first vacuum room 22, in order to keep the extraction most appropriate against changes in various conditions, it is preferable to provide a mechanism which can vary the distance between the nozzle 26 and the skimmer 28 continuously.

An example of a mechanism for continuously varying the distance between the nozzle 26 and the skimmer 28 will be described with reference to FIG. 23. As shown in this figure, in this mechanism, the discharge room 21 is connected to the first vacuum room 22 by bellows 41, and by moving the reactive gas discharge room 21 in the arrow $\alpha$ and $\beta$ direction shown in FIG. 23 by extending and compressing the length of the bellows 41, the distance between the nozzle 26 and the skimmer 28 can be continuously varied. Therefore, it is possible to extract supersonic molecular flow E of plasma at the most appropriate manner from the supersonic free jet D of plasma whose state is varying against the changes in various conditions.

In the supersonic molecular flow E of plasma thus extracted into the second vacuum room 23, the gas temperature of plasma is quite low, i.e., below several degrees absolute temperature, that is, the thermal movement velocity of heavy particles such as neutral atoms and molecules and ions is quite small and the interaction between heavy particles can be ignored. The supersonic molecular flow E of plasma having such characteristics flows into the third vacuum room 24 through the collimator 30 provided at the second partition wall 29. Here, the size of opening of the collimator 30 is below approximately the same as the size of opening of the skimmer 28 and the degree of vacuum in the third vacuum room 24 is held at approximately $10^{-8}$ to $10^{-7}$ Torr and this is displayed by the third vacuum meter 13. Since a substrate to be etched 1 is provided on an electrode 2 confronting the supersonic molecular flow J of plasma which has flown into the third vacuum room 24 through the collimator 30, the supersonic molecular flow J of plasma is vertically blown to the substrate to be etched 1.

Since the supersonic molecular flow J of reactive weakly ionized plasma which has quite low gas temperature such a below several degrees absolute temperature and has quite low thermal movement velocity of heavy particles such as neutral atoms and molecules and ions so that the interaction between heavy particles can be ignored is blown to the substrate to be etched 1, the ions and neutral atomic and molecular radicals of the reactive weakly ionized plasma are incident perpendicular to the surface of the substrate as a low temperature and low energy reactive particle beam. Therefore, the velocity component parallel to the surface of substrate of ions and neutral atomic and molecular radicals is quite small as compared with the incident velocity in the vertical direction and the input energy is quite low as compared with the physical sputtering threshold.

Here, when $Cl_2$ is used for the etching gas A similarly as in the prior art and He is used for the light element gas B, Cl is generated as neutral atomic radicals, $Cl^+$ and $He^+$ are generated as atomic ions, and $Cl_2^+$ is generated as molecular ion. In the case of this example, there are no molecular radicals. Furthermore, the gas density of the supersonic molecular flow of plasma, that is, the density of heavy particles such as neutral atoms and molecules and ions is approximately $10^{12}$ to $10^{15}$ $cm^{-3}$ and the plasma density is approximately $10^9$ to $10^{12}$ $cm^{-3}$. Here, when the gas temperature $T_0$ in the discharge room 21 is $10^{4°}$ K. and the mixed ratio of Cl gas and He gas is below approximately 5%, the upper limit of the supersonic molecular flow in the flow direction $(5\ kT_0/M_{He})^{\frac{1}{2}}$ is approximately $1\times10^6$ cm/sec, and the kinetic energies with respect to He and $Cl_2$ are about 2 eV and 19 eV, respectively.

Figure 24:
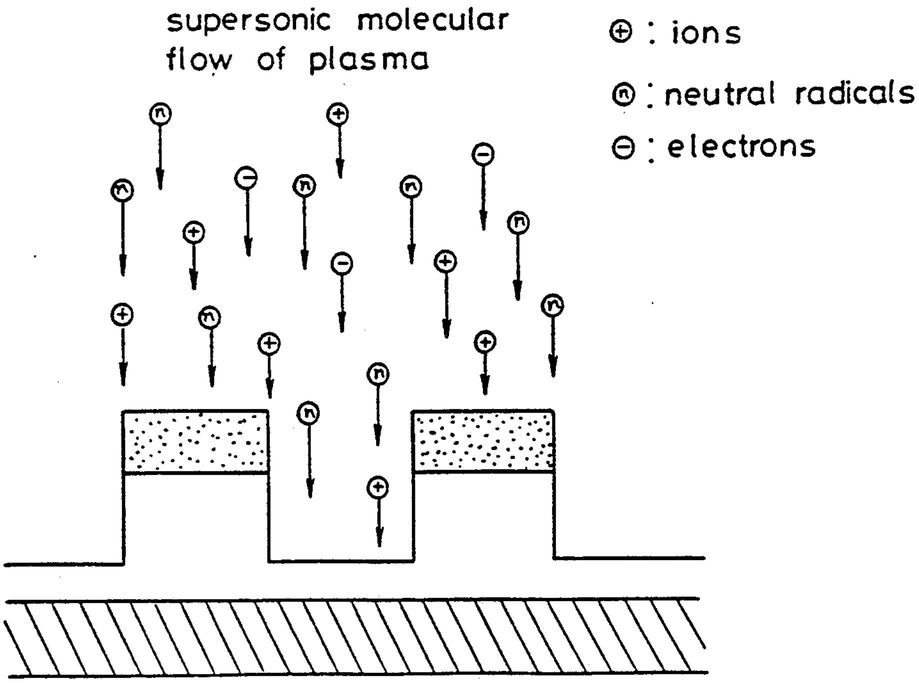
FIG. 24 is a schematic diagram showing the manner in which the plasma particles are incident on the substrate to be etched in the apparatus of the sixth embodiment.

FIG. 24 is a schematic diagram showing a mechanism in which the substance on the substrate disposed on the electrode confronting the supersonic molecular flow of plasma is etched in a dry etching apparatus using supersonic molecular flow of plasma of this embodiment. In this case, similarly as in the prior art, a spare charge region (sheath) is produced in the neighborhood of substrate and positive ions incident to the sheath region are accelerated to the substrate direction.by the sheath voltage (plasma potential) of about 10 V and are vertically incident on the surface of substrate.

On the other hand, the neutral radicals do not respond to the sheath voltage, but differently from the prior art, they are incident perpendicular to the surface of substrate in a state of supersonic molecular flow. Therefore, a chemical etching due to neutral radicals which determine the selectivity of the etching becomes non-isotropic and the anisotropy of the etching is given at the same time.

Furthermore, the incident energy into the surface of substrate of ions is smaller than the physical sputtering threshold of about 20 eV even when accelerated by the sheath voltage and an etching due to a physical sputtering of surface of substrate by ions or competition process of neutral radicals and ions which is called ion assist process does not arise, and the damage to the surface layer of the thin film to be etched do not arise.

After all, in the dry etching apparatus of this embodiment, the anisotropic chemical etching due to neutral radicals which are incident on the surface of substrate at high speed controls the etching process of substance on substrate and an etching that satisfies not only super high anisotropy but also super high selectivity and super low likelihood of damage is carried out.

As described above. in this embodiment, the plasma 10 of the mixture of etching gas A and light element gas B generated by discharge is supersonically expanded into the first vacuum room 22 through the nozzle 26 thereby to produce a supersonic free jet D of plasma and supersonic molecular flow E of plasma is extracted into the second vacuum room 23 through the skimmer 28 from the supersonic free jet D, and this supersonic molecular flow of plasma which has quite low gas temperature and quite low thermal movement velocity o heavy particles such a neutral atoms and molecules and ions so that the interaction between heavy particles can be ignored is blown to a substrate to be etched 1 in the third vacuum room 24 through a collimator 30. Therefore, ions and neutral atoms and molecules of plasma are incident perpendicular to the surface of substrate as a low temperature and low energy particle beam. In this case, the velocity component parallel to the surface of substrate of ions and neutral radicals is quite low a compared with the incident speed in the vertical direction and the incident energy is quite low as compared with the physical sputtering threshold. Furthermore, when the mixed ratio of the reactive gas to the light element gas is reduced, the incident velocity of ions or neutral radicals in a direction vertical to the surface of substrate with respect to the reactive gas is approximately equal to the incident velocity of atoms and molecules with respect to the light element gas. As a result, the anisotropic chemical etching due to neutral radicals controls the etching process of the substance on the substrate and an etching that satisfies not only super high anisotropy but also super high selectivity and super low likelihood of receiving damages is carried out.

Figure 23:
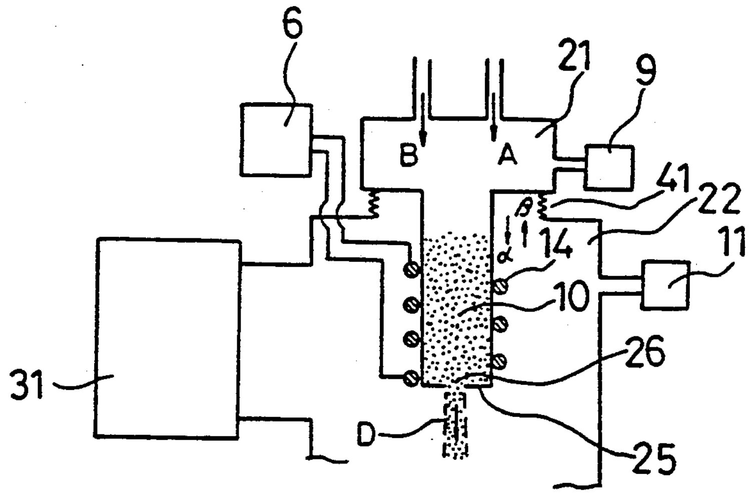
FIG. 23 is a cross-sectional view showing an example of a mechanism for varying the distance between the nozzle and skimmer continuously in the apparatus of the sixth embodiment.

Furthermore, in this embodiment, a mechanism for varying the distance between the nozzle 26 and the skimmer 28 continuously is provided as shown in FIG. 23 so, it is possible to extract the supersonic molecular flow E of plasma in a most appropriate manner from the supersonic free jet D of plasma whose state changes in response to the change in various conditions.

In the above-illustrated embodiment, the incident energy of ions and neutral radicals is lower than the physical sputtering threshold, the incident energy can be larger than the physical sputtering threshold and physical sputtering using ions can be carried out.

For example, depending on the kind of material to be etched, it is required that the incident energy into the surface of substrate of ions should be made higher than the physical sputtering threshold and that not only the anisotropical chemical etching due to neutral radicals but also an etching using a physical sputtering due to ions and ion assist process which is a competition process of neutral radicals and ions should be added. Accordingly, in order to carry out a most appropriate etching in response to the various substances to be etched, it is preferable to provide means for increasing the incident energy into surface of substrate of ions independently.

Another embodiment of the present invention in which a means for increasing the incident energy of ions is provided will be described with reference to FIG. 25.

Figure 25:
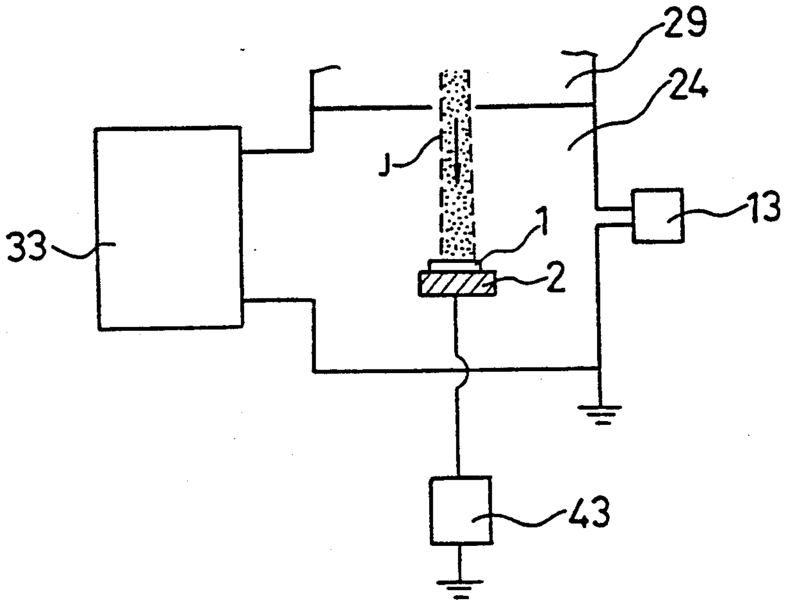
FIG. 25 is a cross-sectional view showing a part for applying RF power to an electrode for mounting a substrate to be etched of the apparatus of the sixth embodiment.

As shown in FIG. 25 an RF electrode applying means 43 for applying RF power to the electrode 2 on which substrate to be etched 1 is mounted is provided and by generating a self bias voltage at the electrode 2, the sheath voltage (plasma potential+self bias voltage of electrode) which is produced in the neighborhood of substrate is increased. That is, when the RF power is increased, the sheath voltage which is produced in the neighborhood of the substrate is increased and the acceleration due to sheath voltage of ions which are incident to the sheath region is increased and the incident energy of ions into the surface of substrate is increased. Thereby, not only the anisotropic chemical etching due to neutral radicals, a physical sputtering due to ions and ion assist process etching which is a competition process of neutral radicals and ions can be carried out.

A seventh embodiment of the present invention will be described hereinafter.

Figure 26:
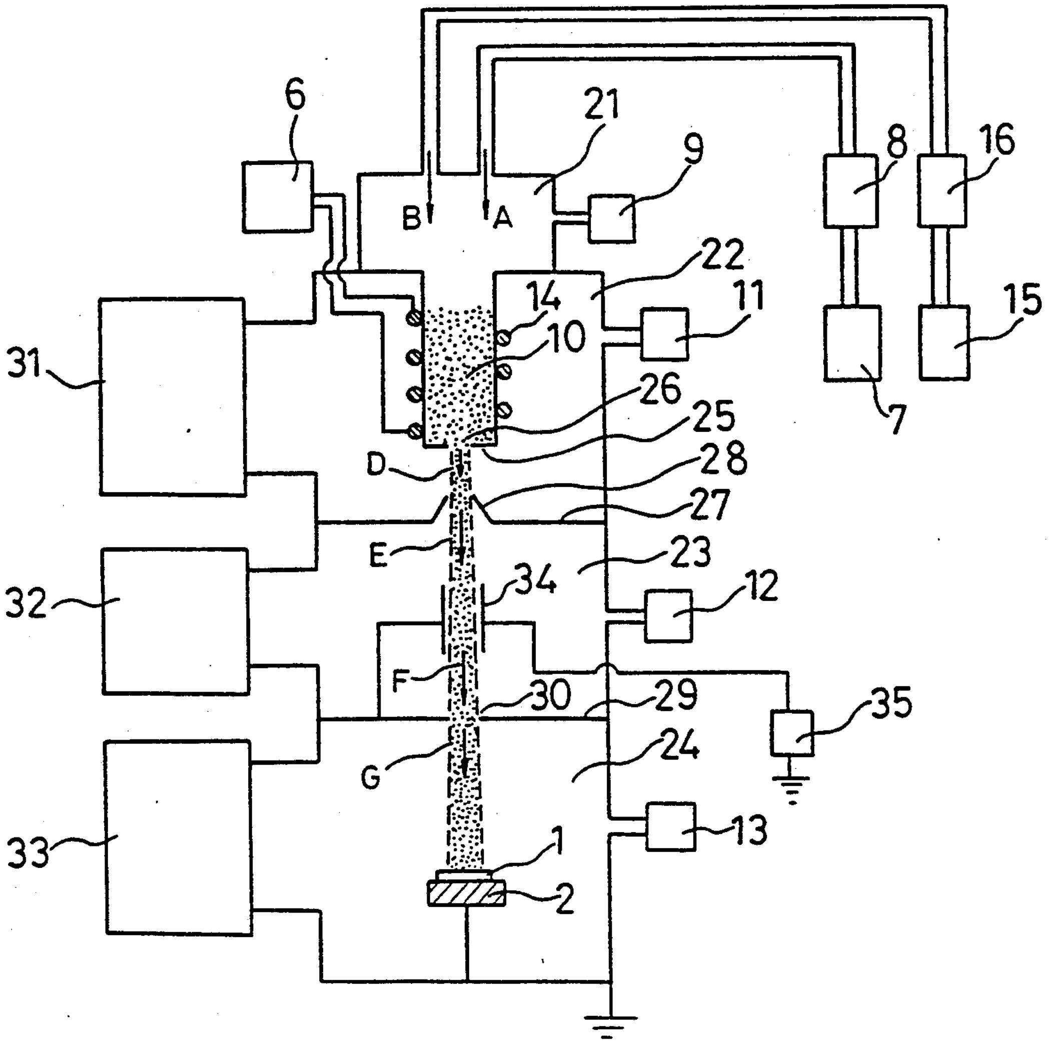
FIG. 26 is a cross-sectional view showing a construction of a dry etching apparatus according to a seventh embodiment of the present invention.

FIG. 26 is a cross-sectional view showing a main part of a construction of a dry etching apparatus according to a seventh embodiment of the present invention. In FIG. 26, the same reference numerals designate the same or corresponding portions as those shown in FIG. 20. Reference numeral 34 designates a pair of charged particle removing electrodes provided in the second vacuum room 23 for removing charged particles such as ions or electrons from the supersonic molecular flow E of plasma in the second vacuum room 23 thereby to produce supersonic molecular flow F of neutral atomic and molecular gas. Reference numeral 35 designates a DC voltage applying means for applying a voltage to the pair of electrodes 34. A charged particle removing means is constituted by the electrodes 34 and the DC voltage applying means 35. Reference character G designates a supersonic molecular flow of chemical atomic and molecular gas flowing into the third vacuum room 24 through the collimator 30 among the supersonic molecular flow E of neutral atomic and molecular gas. The substrate to be etched 1 is disposed on the electrode 2 in the third vacuum room 24 so as to confront the supersonic molecular flow G.

A description is given of the operation.

The mixture of etching gas A and light element gas B is ionized in the discharge room 21 and the discharge gas is supersonically expanded to produce a supersonic free jet D in the first vacuum room 22 through the nozzle 26 and the supersonic molecular flow E is extracted into the second vacuum room 23 from jet D by the skimmer 28 similarly as in the first embodiment.

A pair of charged particle removing electrodes 34 are arranged in the second vacuum room 23 on opposite sides of the supersonic molecular flow E of plasma and a voltage is applied to the pair of electrodes 34 by a DC voltage applying means 35 and an electric field is generated in a direction perpendicular to the center axis of the supersonic molecular flow E. Therefore, the ions and electrons of the supersonic molecular flow E of plasma the flow between the pair of electrodes 34 are separated and moved in opposite directions by the electric field in the direction vertical to the center axis of the flow of supersonic molecular flow E and are captured by the pair of electrodes 34. As a result, ions and electrons are removed from the supersonic molecular flow E of plasma which has passed through the charged particle removing electrodes 34 and supersonic molecular flow F of neutral atomic and molecular gas is produced.

In the supersonic molecular flow F of neutral atomic and molecular gas generated as described above, similarly as the supersonic molecular flow E of plasma, the gas temperature is quite low, i.e., to be below several degrees in an absolute temperature and the thermal movement velocity of neutral atoms and molecular is quite low and the interaction between particles can be ignored. The supersonic molecular flow F of neutral atomic and molecular gas having such characteristics flows into the third vacuum room 24 through the collimator 30 arranged at the second partition wall 29. Here, the length of short edge of opening of the collimator 30 is less than approximately the length of the short edge of opening of the skimmer 28 similarly as in the sixth embodiment and the degree of vacuum in the third vacuum room 24 is kept at approximately $10^{-8}$ to $10^{-7}$ Torr and this is displayed on the third vacuum meter 13.

In the above-described third vacuum room 24, the supersonic molecular flow G of neutral atomic and molecular gas which flows thereinto through the collimator 30 is vertically blown to the substrate to be etched 1 mounted on the electrode 2.

As described above, since a supersonic molecular flow G of reactive neutral atomic and molecular gas which has quite low gas temperature, i.e., below several degrees in an absolute temperature and has quite low thermal movement velocity of neutral atoms and molecules so that the interaction between particles can be ignored is blown to the substrate to be etched 1, the neutral atomic and molecular radicals of the reactive neutral atomic and molecular gas are incident perpendicular to the surface of substrate as a reactive particle beam of low temperature and low energy. Therefore, the velocity component parallel to the substrate surface of neutral atomic and molecular radicals is quite low as compared with the incident velocity in the vertical direction, and the incident energy is quite low as compared with the physical sputtering threshold.

Figure 27:
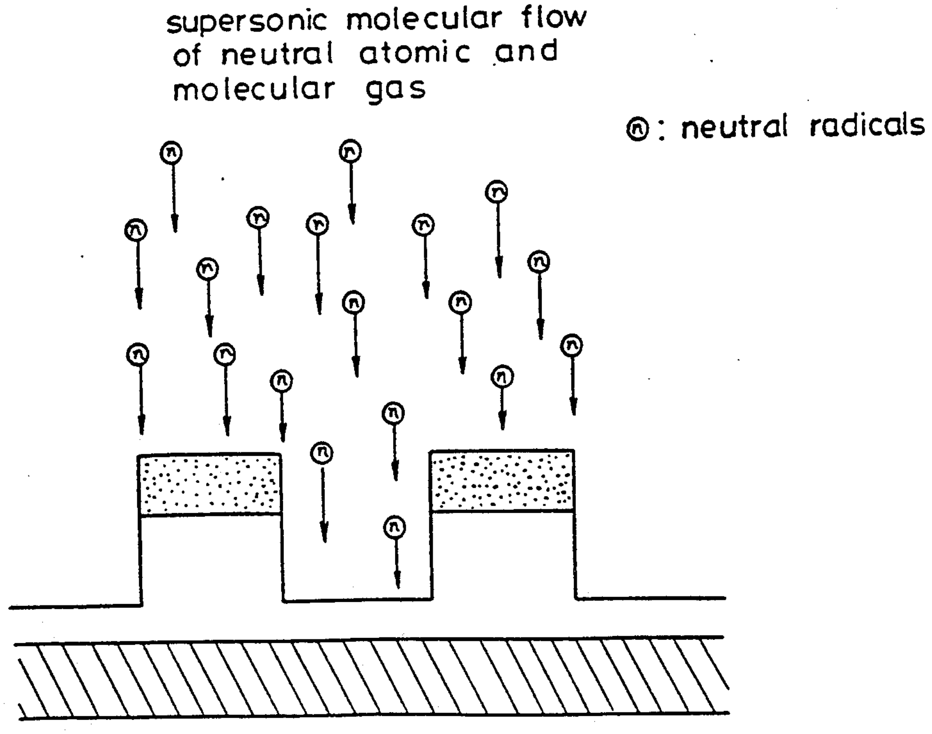
FIG. 27 is a schematic diagram showing a manner in which neutral atoms and molecules are incident on the substrate to be etched in the apparatus of the seventh embodiment.

A mechanism of etching the substance on substrate arranged confronting the supersonic molecular flow of neutral atomic and molecular gas in the dry etching apparatus of this seventh embodiment apparatus will be described with reference to FIG. 27. In this embodiment, since etching is carried out using not plasma but neutral atomic and molecular gas, a space charge region (sheath) is not produced in the neighborhood of substrate and there is no contribution to the etching of ions. On the other hand, the neutral atomic, and molecular radicals are vertically incident to the surface of substrate in a state of supersonic molecular flow, the chemical etching of substance on the substrate due to neutral radicals becomes non-isotropic and not only selectivity of etching but also anisotropy of etching are achieved at the same time.

Therefore, in the dry etching apparatus of this embodiment, the etching of the substance on the substrate proceeds only by the non-isotropic chemical etching due to neutral radicals incident on the substrate surface at a high speed and an etching that satisfies not only super high anisotropy but also the super high selectivity and super low likelihood of damage is carried out.

Here, the supersonic molecular flow F of neutral atomic and molecular gas which is generated by removing ions and electrons from the supersonic molecular flow E of plasma includes $Cl_2$ as atomic radicals and the gas density is approximately $10^{12}$ to $10^{15}$ $cm^{-3}$. Furthermore, when the gas temperature $T_0$ in the discharge room 21 is $10^{4\circ}$ K. and the mixed ratio of Cl gas and He gas is below approximately 5%, as described in the sixth embodiment, the upper limit of the speed of the supersonic molecular flow in the flow direction $(5\ kT_0/M_{He})^{\frac{1}{2}}$ is approximately $1\times10^6$ cm/sec and the kinetic energies with respect to He and Cl are about 2 eV and 19 eV, respectively.

In this embodiment, the plasma 10 of the mixed gas of etching gas A and light element gas B generated by discharge is supersonically expanded into the first vacuum room 22 through the nozzle 26 thereby to produce a supersonic free jet D of plasma and a supersonic molecular flow E of plasma having quite low gas temperature so that the interaction between heavy particles can be ignored is extracted into the second vacuum room 23 through the skimmer 28 from the supersonic free jet D, and further ions and electrons are removed from this supersonic molecular glow E of plasma by charged particle removing means thereby to produce a supersonic molecular flow F of neutral atoms and molecular gas that has quite low gas temperature and quite low thermal movement velocity of neutral atoms and molecules so that the interaction between particles can be ignored, and the supersonic molecular flow F of neutral atoms and molecular gas is blown to the substrate to be etched 1 through the collimator 30, whereby the neutral atoms and molecules are incident perpendicular to the substrate as a low temperature and low energy particle beam.

In this case, the velocity component parallel with the surface of substrate of neutral atoms and molecular radicals is quite low as compared with the incident velocity in the vertical direction and the incident energy is quite low a compared with the physical sputtering threshold. Furthermore, when the mixed ratio of the reactive gas to the light element gas is reduced, the incident velocity of the neutral radicals in a direction vertical to the surface of substrate with respect to the reactive gas is approximately equal to the incident velocity of atoms and molecules with respect to the light element gas. Therefore, the etching of the substance on the substrate proceeds only by the non-isotropic chemical etching due to neutral atomic and molecular radicals, whereby an etching that satisfies not only super high anisotropy but also super high selectivity and super low likelihood of damage is realized.

Furthermore, since the etching is carried out by using neutral atomic and molecular radicals, electrostatic destruction due to charge up of substrate to be etched can be prevented.

In the above-illustrated seventh embodiment, ions and electrons of supersonic molecular flow E of plasma are removed by charged particle removing electrode 34 which are provided inside the second vacuum room 23 to produce a supersonic molecular flow I of neutral atomic and molecular gas. However, the charged particle removing electrodes 34 can be provided inside the third vacuum room 24. In this case, the supersonic molecular flow E of plasma flows into the third vacuum room 24 through the collimator 30 and ions and electrons are removed from the supersonic molecular flow of plasma inside the third vacuum room 24 and supersonic molecular flow F of neutral atomic and molecular gas are is produced.

In the above-illustrated seventh embodiment, an electric field is used only for the charged particle removing means, but both an electric field and a magnetic field can be used.

Figure 28:
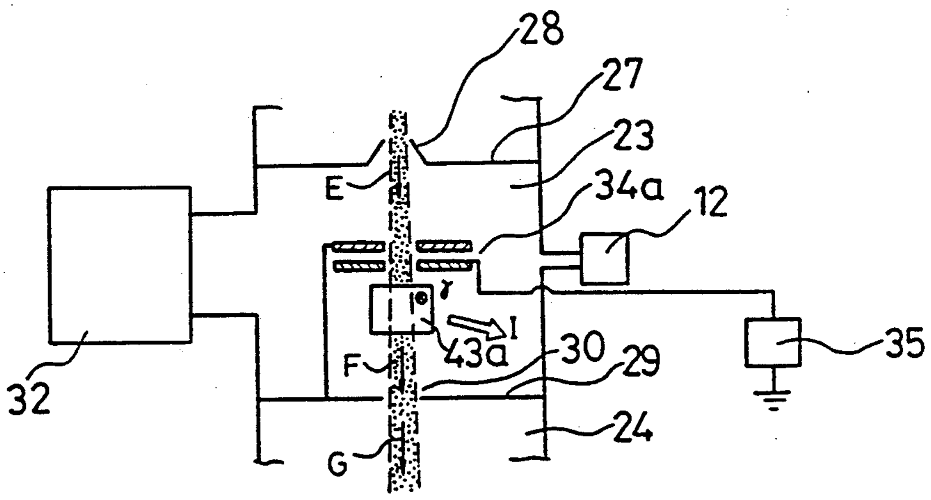
FIG. 28 is a cross-sectional view showing removal of charged particles carried out by using an electric field and a magnetic field in the apparatus of the seventh embodiment.

FIG. 28 shows a construction using an electric field and a magnetic field. In this construction, a pair of electrodes 34*a* having opening at the center are provided confronting the supersonic molecular flow E of plasma and a voltage is applied to the pair of electrodes 34*a* by a DC voltage applying means 35 and an electric field is generated in a direction parallel with the flow of the supersonic molecular flow E.

In this case, ions and electrons of supersonic molecular flow E of plasma flowing between the pair of electrodes 34*a* are separated and moved in opposite directions by the electric field parallel with the flow direction of the supersonic molecular flow and are changed in direction by the magnetic field applying means 43*a* using a permanent magnet or electromagnet coil provided subsequent to the pair of electrodes 34*a* and removed from the supersonic molecular flow to produce supersonic atomic and molecular flow F of neutral atomic and molecular gas. Here, the polarity of the DC voltage applying means 35 is negative and the direction of magnetic field $\gamma$ produced by the magnetic field applying means 43*a* is perpendicular to the supersonic molecular flow and I is an ion flow whose direction is changed by the magnetic field $\gamma$.

An eighth embodiment of the present invention will be described.

Figure 29:
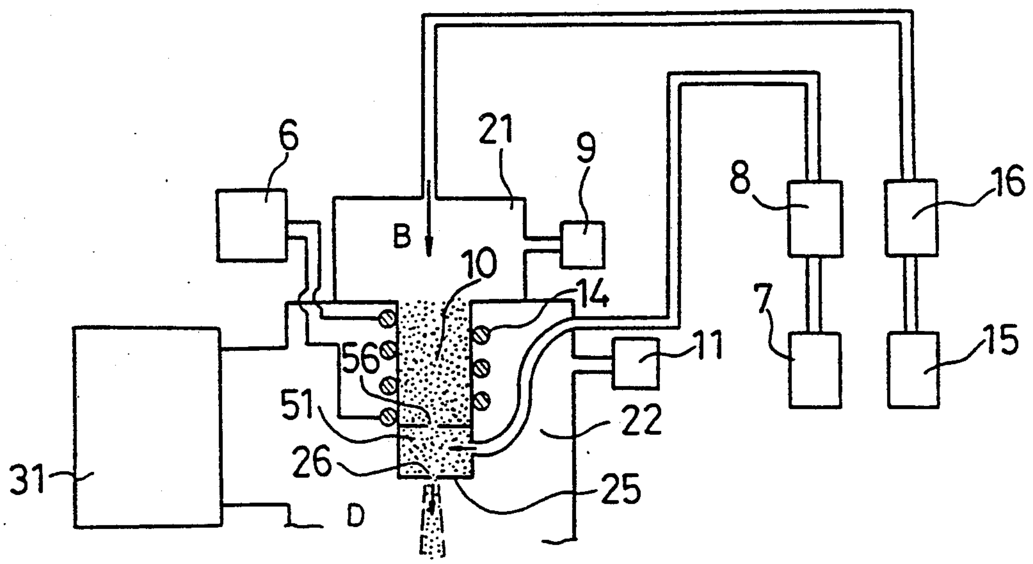
FIG. 29 is a cross-sectional view showing a discharge room divided into two rooms in the apparatus of the eighth embodiment.

FIG. 29 is a cross-sectional view showing the neighborhood of the discharge room 21 of a dry etching apparatus according to the eighth embodiment of the present invention. In FIG. 29, the same reference numerals designate the same or corresponding portions as those shown in FIGS. 20 and 26. The discharge room 21 is divided into two rooms, and the first room is used for ionizing the light element gas B such as helium or hydrogen which is introduced thereinto and the second room 51 is used for mixing both gases, one of which is plasma gas which flows thereinto and the other is reactive gas which is further introduced. These first and second rooms are connected through an aperture 56.

A description is given of the operation.

The light element gas B such as helium or hydrogen is introduced into the first room of the discharge room 21, and the light element gas is ionized. The ionized gas passes through the aperture 56 and flows into the second room 51 and is mixed with the etching gas A. Therefore, the ionization and decomposition of etching gas atoms and molecules proceed not by the direct discharge but by the interaction with the light element gas plasma generated by the direct discharge, that is, the collision between the light element gas atoms and molecules or plasma generated and excited by the ionization and resolution and the etching gas atoms and molecules. Accordingly, the amount of neutral radicals generated by the reactive gas atoms and molecules that are decomposed is larger than that by direct discharge, and the degree of corrosion or damage of discharge room due to the direct discharge of reactive gas is reduced.

Since the supersonic molecular flow of plasma extracted from the plasma generated as described above or the supersonic molecular flow of neutral atomic or molecular gas which is obtained by removing ions or electrons from the supersonic molecular flow of plasma by the above described charged particle removing means is blown to a substrate to be etched thereby to carry out etching, an etching that satisfies super high anisotropy, super high selectivity, and super low likelihood of damage can be obtained at higher speed and deterioration of the discharge room is suppressed and the life time is lengthened.

Furthermore, in the above-illustrated sixth to eighth embodiments, the generation of plasma in the reactive gas discharge room 21 is carried out by a high frequency induction glow discharge using RF or an arc discharge, that is, by inducing a high frequency current inside indirectly by such as coil 14 which is attached to the outside the discharge room 21. This can be carried out by a high frequency glow discharge or arc discharge using RF or microwave, that is, by arranging a confronting electrode or antenna in the discharge room 21 thereby to introduce high frequency power directly into the discharge room to generate plasma. Furthermore a construction in which plasma is generated by beam irradiation ionization discharge using such as electron beam, ion beam, neutral particle beam, or laser beam can be employed.

In the above-illustrated embodiment, $Cl_2$ is used for the etching gas A, and polycrystalline silicon on the substrate to be etched 1 is etched, but another etching gas can be used and a material to be etched other than polycrystalline silicon can be etched by an appropriate etching gas.

In the above-illustrated embodiment the frequency of the RF power applying means 6 and 43 are 13.56 MHz, but another frequency can be use.

Furthermore, in the above-illustrated embodiment He is used for the light element gas, but such as hydrogen can be used.

Furthermore, in the above-illustrated embodiment the size of opening of the nozzle 26 is approximately 1 mm in diameter, but the size of the opening of nozzle 26 can be made larger than approximately 1 mm by increasing the exhaustion speed of the first vacuum exhaustion means 31 and further the size of the opening of the skimmer 28 can be increased corresponding to the size of the opening of nozzle 26 by increasing the exhaustion speed of the second vacuum exhaustion means 32.

In this case, in the above-described sixth embodiment apparatus, the flow flux of supersonic molecular flow E of plasma which is extracted through the skimmer 28 is increased, by increasing the size of the collimator 30, and by increasing the exhaustion speed of the third vacuum exhaustion means 33 so that, the etching area on the substrate to be etched 1 and the etching speed are increased.

In the above-illustrated seventh embodiment apparatus, the flow flux of supersonic molecular flow E of plasma which is extracted from the supersonic molecular flow E of plasma extracted through the skimmer 28 or the flow flux of the supersonic molecular flow F of neutral atomic and molecular gas which is taken out through the charged particle removing electrodes 34 is increased, by increasing the size of the collimator 30, by increasing the exhaustion speed of the third vacuum exhaustion means 33, the etching area of the substrate to be etched 1 and the etching speed can be increased.

In the eighth embodiment apparatus, the same effects as those obtained in the sixth or seventh embodiments can be obtained.

As is evident from the foregoing description, according to a first aspect of the present invention, in a dry etching apparatus, plasma generated by discharge is introduced into a first vacuum room through a nozzle and is supersonically expanded thereby to produce a supersonic free jet of plasma, and further a supersonic molecular flow of plasma is extracted into a second vacuum room through a skimmer from that supersonic free jet, and this supersonic molecular flow of plasma is blown to a substrate to be etched thereby to carry out an etching. Therefore, an etching that satisfies super high selectivity and super low likelihood of damage as well as super high anisotropy is possible.

According to a second aspect of the present invention, in addition to the discharge room and first and second vacuum rooms, a charged particle removing means for removing charged particles from the supersonic molecular flow of plasma extracted into the second vacuum room and producing a supersonic molecular flow of neutral atomic and molecular gas is provided, and this supersonic molecular flow of neutral atomic and molecular gas is blown to the substrate to be etched. Therefore, super high anisotropy, super high selectivity, and super low likelihood of damage can be satisfied at the same time and an electrostatic destruction due to charge-up of substrate to be etched can be prevented.

According to a third aspect of the present invention, plasma generated by discharge is supersonically expanded into a first vacuum room to produce a supersonic free jet of plasma through a two-dimensional nozzle having an opening whose cross-section is of rectangular slit shape, and further a supersonic molecular flow of plasma is extracted into a second vacuum room from the supersonic free jet through the two-dimensional skimmer having an opening whose cross-section is a rectangular slit shape, and the supersonic molecular flow of plasma is blown to a substrate to be etched thereby to carry out etching. Therefore, an etching that satisfies not only the super high anisotropy but also super high selectivity and super low likelihood of damage is possible According to a fourth aspect of the present invention, in addition to the discharge room, two-dimensional nozzle, first vacuum room, two-dimensional skimmer, and second vacuum room, a charge particle removing means for removing charged particles from the supersonic molecular flow of plasma extracted into the second vacuum room and producing supersonic molecular flow of neutral atoms and molecules is provided, and the supersonic molecular flow is blown to a substrate to be etched. Therefore, electrostatic destruction caused by charge-up of the substrate to be etched due to charged particles can be prevented.

According to a fifth aspect of the present invention, in addition to that the discharge room, first and second vacuum rooms, and two-dimensional nozzle and skimmer whose opening cross-sections are of rectangular slit shape are provided, the position of the substrate to be etched is moved in the short edge direction relative to the supersonic molecular flow whose cross-section in a direction vertical to the flow is a rectangular slit shape, during the etching. Therefore, an etching that satisfies super high anisotropy, super high selectivity, and super low likelihood of damage is possible against a large sized substrate.

According to a sixth aspect of the present invention, a reactive gas and light element gas such as helium or hydrogen is introduced to a discharge room, plasma of mixed gas is generated, the plasma is supersonical expanded into the first vacuum room through a nozzle to produce a supersonic jet of plasma, and further the supersonic molecular flow of plasma is extracted into the second vacuum room from the supersonic free jet through a skimmer, and the supersonic molecular flow of plasma is blown to the substrate to be etched thereby to carry out an etching. Therefore, an etching which satisfies not only super high anisotropy but also super high selectivity and super low likelihood of damage can be realized at high speed.

According to a seventh aspect of the present invention, in addition to the discharge room, nozzle, first vacuum room, skimmer, and second vacuum room are provided and the reactive gas and the light element gas such as helium or hydrogen are introduced into the discharge room thereby to produce a plasma of the mixed gas, a charged particle removing means for removing ions and electrons as charged particles from the supersonic molecular flow of plasma extracted into the second vacuum room and producing a supersonic molecular flow of neutral atomic and molecular gas is provided, and the supersonic molecular flow of neutral atomic and molecular gas is blown to a substrate to be etched thereby to carry out an etching. Therefore, a high speed etching that satisfies super high anisotropy, super high selectivity, and super low likelihood of damage at the same time is possible, and further an electrostatic destruction caused by charge up of the substrate to be etched due to charged particles can be prevented.

According to an eighth aspect of the present invention, the discharge room is divided into two rooms and a first room is used for ionizing the light element gas such as helium or hydrogen which is introduced thereinto and a second room is used for mixing both gases one of which is the plasma gas which flows thereinto and the other is reactive gas which is further introduced, and the supersonic molecular flow of plasma extracted into the second vacuum room through the nozzle, first vacuum room, and skimmer or the supersonic molecular flow of neutral atomic and molecular gas which is obtained by removing ions and electrons as charged particles from the supersonic molecular flow of plasma by the charged particle removing means is blown to a substrate to be etched thereby to carry out an etching. Therefore, an etching that satisfies super high anisotropy, super high selectivity, and a super low likelihood of damage can be obtained at higher speed, and deterioration of discharge room is suppressed and the life time is lengthened.

What is claimed is:

1. A dry etching apparatus for etching material comprising:

a discharge room containing a discharge for generating a plasma gas by ionizing atoms and molecules of a first gas;

a first vacuum room;

an ejection nozzle connecting said discharge room to said first vacuum room for introducing and supersonically expanding said plasma gas from said discharge room into said first vacuum room;

a second vacuum room; and a skimmer connecting said first and second vacuum rooms for extracting a supersonic molecular flow from said first vacuum room and introducing said supersonic molecular flow into said second vacuum room wherein said supersonic molecular flow of said plasma gas in said second vacuum room is blown against a material to be etched.

2. A dry etching apparatus as defined in claim 1 comprising means for removing ions and electrons from said supersonic molecular flow of said plasma gas flowing into said second vacuum room and for producing a supersonic molecular flow of neutral atomic and molecular gas.

3. A dry etching apparatus as defined in claim 1 wherein said ejection nozzle comprises a two-dimensional nozzle having a slit opening of rectangular cross-section for supersonically expanding said plasma gas generated in said discharge room and said skimmer comprises a two-dimensional skimmer having a slit opening of rectangular cross-section for extracting a supersonic molecular flow from said plasma gas.

4. A dry etching apparatus as defined in claim 3 including means for removing ions and electrons from said supersonic molecular flow of said plasma gas flowing into said second vacuum room and for producing a supersonic molecular flow of neutral atomic and molecular gas.

5. A dry etching apparatus as defined in claim 3 wherein said rectangular slit includes a long edge and a short edge including means for moving a substrate to be etched along a direction of the short edge during etching by said supersonic molecular flow, said molecular flow having a cross-sectional configuration perpendicular to said flow of said rectangular slit.

6. A dry etching apparatus as defined in claim 4 wherein said rectangular slit includes a long edge and a short edge including means for moving a substrate to be etched along a direction of the short edge during etching by said supersonic molecular flow, said molecular flow having a cross-sectional configuration perpendicular to said flow of said rectangular slit.

7. A dry etching apparatus as defined in claim 1 wherein said first gas includes a mixture of a reactive gas and relatively light elemental gas.

8. A dry etching apparatus as defined in claim 3 wherein said first gas includes a mixture of a reactive gas and relatively light elemental gas.

9. A dry etching apparatus as defined in claim 5 wherein said first gas includes a mixture of a reactive gas and relatively light elemental gas.

10. A dry etching apparatus as defined in claim 7 including means for removing ions and electrons from said supersonic molecular flow of said plasma gas flowing into said second vacuum room and for producing a supersonic molecular flow of neutral atomic and molecular gas.

11. A dry etching apparatus as defined in claim 8 including means for removing ions and electrons from said supersonic molecular flow of said plasma gas flowing into said second vacuum room and for producing a supersonic molecular flow of neutral atomic and molecular gas.

12. A dry etching apparatus as defined in claim 9 including means for removing ions and electrons from said supersonic molecular flow of said plasma gas flowing into said second vacuum room and for producing a supersonic molecular flow of neutral atomic and molecular gas.

13. A dry etching apparatus as defined in claim 7 wherein said discharge room is divided into a first room in which the relatively light elemental gas is ionized and a second room in which the reactive gas and relatively light element gas are mixed.

14. A dry etching apparatus as defined in claim 8 wherein said discharge room is divided into a first room in which the relatively light elemental gas is ionized and a second room in which the reactive gas and relatively light element gas are mixed.

15. A dry etching apparatus as defined in claim 9 wherein said discharge room is divided into a first room in which the relatively light elemental gas is ionized and a second room in which the reactive gas and relatively light element gas are mixed.

16. A dry etching apparatus as defined in claim 10 wherein said discharge room is divided into a first room in which the relatively light elemental gas is ionized and a second room in which the reactive gas and relatively light elemental gas are mixed.

17. A dry etching apparatus as defined in claim 11 wherein said discharge room is divided into a first room in which the relatively light elemental gas is ionized and a second room in which the reactive gas and relatively light elemental gas are mixed.

18. A dry etching apparatus as defined in claim 12 wherein said discharge room is divided into a first room in which the relatively light elemental gas is ionized and a second room in which the reactive gas and relatively light elemental gas are mixed.

* * * * *